United States Patent [19]

Hartmann et al.

[11] Patent Number: 5,359,711
[45] Date of Patent: Oct. 25, 1994

[54] DETERMINATION OF LOAD FLOW IN DIRECT CURRENT ELECTRICAL SYSTEMS

[75] Inventors: Michael J. Hartmann, Cary; Glenn P. McCarthy, Round Lake Beach, both of Ill.

[73] Assignee: VECTRA Technologies, Inc., Federal Way, Wash.

[21] Appl. No.: 992,712

[22] Filed: Dec. 18, 1992

[51] Int. Cl.⁵ .................................. 395 155; G06F 15/00
[52] U.S. Cl. ....................................... 395/161; 395/155
[58] Field of Search ............... 395/153, 161, 158, 163, 395/155; 364/715.01, 715.02

[56] References Cited

U.S. PATENT DOCUMENTS

| | | | |
|---|---|---|---|
| 5,222,210 | 6/1993 | Leivian | 395/161 |
| 5,233,686 | 8/1993 | Rickenbach et al. | 395/161 |
| 5,233,688 | 8/1993 | Too | 395/161 |

*Primary Examiner*—Heather R. Herndon
*Assistant Examiner*—Cliff Nguyen Vo

[57] ABSTRACT

A system and method (100,200) which uses a spreadsheet computer program having linked files in which the network architecture and the network element properties are entered and stored by the user. The overall network configuration information is input into a first, (INPUT) file type (102), which includes general parameters such as the battery terminal voltage, cable temperatures, bus (or node) names and bus interconnection information such as cable sizes and number of conductors per node. Cable impedance tables are available in a second, auxiliary (RESIST) file (112). Detailed loading information is entered in a third, (PANEL) file (128), which includes load description, load type (constant power or constant impedance), and load rating data and load status (on or off), which can be sequenced over time. These spreadsheets, or files, cooperate to automatically set up the appropriate YBUS admittance matrix file (120,124) and interactively compute voltages and currents using fourth type (CALC) files (122,126). Thus, the computed currents and short circuit fault currents are based on the actual computed node voltages. Preferably, the system and method include a graphics display module (1 LINE) (130,132), which generates a one line diagram on the display screen, along with the results of the load flow calculations.

11 Claims, 24 Drawing Sheets

| SPREADSHEET DATA TRANSFER ||
|---|---|
| ARROW | DATA |
| A | BUS NAMES, BATTERY VOLTAGE, CHARGER VOLTAGE, AND FAULT CONTRIBUTING EQUIVALENT IMPEDANCE |
| B | BUS CONNECTION RESISTANCES AT SC CABLE TEMP. |
| C | BUS CONNECTION RESISTANCES AT VD CABLE TEMP. |
| D | SC CABLE TEMP. |
| E | VD CABLE TEMP. |
| F | SC OHMS/1000 FT. |
| G | VD OHMS/1000 FT. |
| H | UPDATED SC "Y" BUS |
| I | BUS NAMES AND BATTERY VOLTAGE |
| J | UPDATED VD "Y" BUS |
| K & L | CONSTANT POWER AND RESISTANCE LOADING |
| M | BUS PREFAULT VOLTAGES AND SHORT CIRCUIT FAULT CURRENTS |
| N | RESOLVED BUS VOLTAGES |
| O | OUTPUT: BUS VOLTAGES |
| P | GRAPHICAL OUTPUT: SHORT CIRCUIT FAULT CURRENTS |
| Q | OUTPUT: CORRECTED LOAD AND CIRCUIT BRANCH CURRENTS |
| R | GRAPHICAL OUTPUT: BUS VOLTAGES |
| S | OUTPUT: MULTIPLE "TIME" BUS VOLTAGES AND BUS/PANEL CURRENT TOTALS |

*Fig. 1A.*

| INPUT.XLS | | FAULT CONTRIBUTING EQUIVALENT IMPEDANCE (OHMS) |
|---|---|---|
| BUS # | BUS NAME | |
| 1 | | |
| 2 | | |
| 3 | | |
| 4 | | |
| 5 | | |
| 6 | | |
| 7 | | |
| 8 | | |
| 9 | | |
| 10 | | |
| 11 | | |
| 12 | | |
| 13 | | |
| 14 | | |
| 15 | | |
| 16 | | |
| 17 | | |
| 18 | | |
| 19 | | |
| 20 | | |
| 21 | | |
| 22 | | |
| 23 | | |
| 24 | | |
| 25 | | |
| 26 | | |
| 27 | | |
| 28 | | |
| 29 | | |
| 30 | | |
| 31 | | |
| 32 | | |
| 33 | | |

SHORT CIRCUIT INFORMATION

USE TWO-WAY CABLE LENGTH FOR RESISTANCE (YES/NO): | NO |
CABLE TEMPERATURE: | |
BATTERY VOLTAGE AT T=0-: | |
CHARGER VOLTAGE AT T=0-: | |
CHARGER FAULT LIMITING CURRENT: | |

VOLTAGE DROP INFORMATION

CABLE TEMPERATURE: | |
TIME NUMBER: | 1 |
BATTERY VOLTAGE AT 0 MIN.: | 0.0 V |
TIME: | 0.00MIN. |

*Fig. 5.*

| INPUT.XLS | | | | | |
|---|---|---|---|---|---|
| TOGGLE 1=CLOSED 0=OPEN | BUS CONNECTIONS | | CABLE LENGTH (IN FT) (ONE DIRECTION) | # OF PARALLEL CONDUCTORS (ONE DIRECTION) | CABLE LETTER DESIGNATION |
| | FROM BUS (#) | TO BUS (#) | | | |
| | | | | | |

| INPUT.XLS | | | | |
|---|---|---|---|---|
| WIRE SIZE (AWG) OR (KCMIL) | SHORT CIRCUIT | | VOLTAGE DROP | |
| | R @ °C (OHMS/1000') | R @ °C (OHMS) | R @ °C (OHMS/1000') | R @ °C (OHMS) |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |
| -- | -- | -- | -- | -- |

| RESIST. NEC: SHORT CIRCUIT CABLE RESISTANCE | | | | TEMP. CORRECTION |
|---|---|---|---|---|
| CABLE DESIG-NATION | WIRE SIZE (AWG/ KCMIL) | STRANDING QUANTITY | R1 @ 75 °C (OHMS/1000') | R2 @ °C (OHMS/1000') |
| A | 18 | 1 | 7.77 | 7.7700 |
| B | 16 | 1 | 4.89 | 4.8900 |
| C | 14 | 1 | 3.07 | 3.0700 |
| D | 12 | 1 | 1.93 | 1.9300 |
| E | 10 | 1 | 1.21 | 1.2100 |
| F | 8 | 1 | 0.764 | 0.7640 |
| G | 6 | 7 | 0.491 | 0.4910 |
| H | 4 | 7 | 0.308 | 0.3080 |
| I | 3 | 7 | 0.245 | 0.2450 |
| J | 2 | 7 | 0.194 | 0.1940 |
| K | 1 | 19 | 0.154 | 0.1540 |
| L | 1/0 | 19 | 0.122 | 0.1220 |
| M | 2/0 | 19 | 0.0967 | 0.0967 |
| N | 3/0 | 19 | 0.0766 | 0.0766 |
| O | 4/0 | 19 | 0.0608 | 0.0608 |
| P | 250 | 37 | 0.0515 | 0.0515 |
| Q | 300 | 37 | 0.0429 | 0.0429 |
| R | 350 | 37 | 0.0367 | 0.0367 |
| S | 400 | 37 | 0.0321 | 0.0321 |
| T | 500 | 37 | 0.0258 | 0.0258 |
| U | 600 | 61 | 0.0214 | 0.0214 |
| V | 700 | 61 | 0.0184 | 0.0184 |
| W | 750 | 61 | 0.0171 | 0.0171 |

| RESIST. NEC: VOLTAGE DROP CABLE RESISTANCE | | | | TEMP. CORRECTION |
|---|---|---|---|---|
| CABLE DESIG-NATION | WIRE SIZE (AWG/ KCMIL) | STRANDING QUANTITY | R1 @ 75 °C (OHMS/1000') | R2 @ °C (OHMS/1000') |
| A | 18 | 7 | 8.45 | 8.4500 |
| B | 16 | 7 | 5.29 | 5.2900 |
| C | 14 | 7 | 3.26 | 3.2600 |
| D | 12 | 7 | 2.05 | 2.0500 |
| E | 10 | 7 | 1.29 | 1.2900 |
| F | 8 | 7 | 0.809 | 0.8090 |
| G | 6 | 7 | 0.51 | 0.5100 |
| H | 4 | 7 | 0.321 | 0.3210 |
| I | 3 | 7 | 0.254 | 0.2540 |
| J | 2 | 7 | 0.201 | 0.2010 |
| K | 1 | 19 | 0.16 | 0.1600 |
| L | 1/0 | 19 | 0.127 | 0.1270 |
| M | 2/0 | 19 | 0.101 | 0.1010 |
| N | 3/0 | 19 | 0.0797 | 0.0797 |
| O | 4/0 | 19 | 0.0626 | 0.0626 |
| P | 250 | 37 | 0.0535 | 0.0535 |
| Q | 300 | 37 | 0.0446 | 0.0446 |
| R | 350 | 37 | 0.0382 | 0.0382 |
| S | 400 | 37 | 0.0331 | 0.0331 |
| T | 500 | 37 | 0.0265 | 0.0265 |
| U | 600 | 61 | 0.0223 | 0.0223 |
| V | 700 | 61 | 0.0189 | 0.0189 |
| W | 750 | 61 | 0.0176 | 0.0176 |

| CABLE DESIG-NATION | WIRE SIZE (AWG/ KCMIL) | STRANDING QUANTITY | R1 @ 75 °C (OHMS/1000') | TEMP. CORRECTION R2 @ °C (OHMS/1000') |
|---|---|---|---|---|
| A | 22 | | 16.7 | 16.7000 |
| B | 20 | | 10.5 | 10.5000 |
| C | 19 | | 8.33 | 8.3300 |
| D | 18 | | 6.67 | 6.6700 |
| E | 16 | | 4.18 | 4.1800 |
| F | 14 | | 2.63 | 2.6300 |
| G | 12 | | 1.66 | 1.6600 |
| H | 10 | | 1.04 | 1.0400 |
| I | 9 | | 0.825 | 0.8250 |
| J | 8 | | 0.652 | 0.6520 |
| K | 6 | | 0.411 | 0.4110 |
| L | 4 | | 0.258 | 0.2580 |
| M | 3 | | 0.205 | 0.2050 |
| N | 2 | | 0.162 | 0.1620 |
| O | 1 | | 0.129 | 0.1290 |
| P | 1/0 | | 0.102 | 0.1020 |
| Q | 2/0 | | 0.081 | 0.0810 |
| R | 3/0 | | 0.0642 | 0.0642 |
| S | 4/0 | | 0.051 | 0.0510 |
| T | 250 | | 0.0431 | 0.0431 |
| U | 350 | | 0.308 | 0.308 |
| V | 500 | | 0.0216 | 0.0216 |
| W | 750 | | 0.0144 | 0.0144 |
| X | 1000 | | 0.0108 | 0.0108 |
| Y | 1250 | | 0.00863 | 0.0088 |
| Z | 1500 | | 0.00719 | 0.0072 |
| AA | 1750 | | 0.00616 | 0.0062 |
| AB | 2000 | | 0.00539 | 0.0054 |

Fig. 10.

| PANELS.XLS | | |
|---|---|---|
| CIRCUIT BREAKER NUMBER | CIRCUIT DESCRIPTION | CIRCUIT BREAKER RATING |
| | | |

|  |  | TIME NUMBER: |  |
|---|---|---:|---|
|  |  | BATTERY VOLTAGE AT MIN.: |  |
|  |  | TIME: |  |

| CONSTANT POWER OR IMPEDANCE POWER "P" IMPED "Z" | PANELS.XLS | | | TOGGLE ON=1 OFF=0 |
|---|---|---|---|---|
| | LOAD RATINGS | | | |
| | POWER (W) | CURRENT (A) | VOLTAGE (V) | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |
| | | | | |

*Fig. 15.*

| PANELS.XLS | | |
|---|---|---|
| RESISTANCE (OHMS) | POWER (W) | CORRECTED CURRENT (A) |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |
| - | - | - |

| FAULT CURRENT RESULTS ||
|---|---|---|
| 1 | | 0 A |
| 2 | | 0 A |
| 3 | | 0 A |
| 4 | | 0 A |
| 5 | | 0 A |
| 6 | | 0 A |
| 7 | | 0 A |
| 8 | | 0 A |
| 9 | | 0 A |
| 10 | | 0 A |
| 11 | | 0 A |
| 12 | | 0 A |
| 13 | | 0 A |
| 14 | | 0 A |
| 15 | | 0 A |
| 16 | | 0 A |
| 17 | | 0 A |
| 18 | | 0 A |
| 19 | | 0 A |
| 20 | | 0 A |
| 21 | | 0 A |
| 22 | | 0 A |
| 23 | | 0 A |
| 24 | | 0 A |
| 25 | | 0 A |
| 26 | | 0 A |
| 27 | | 0 A |
| 28 | | 0 A |
| 29 | | 0 A |
| 30 | | 0 A |
| 31 | | 0 A |
| 32 | | 0 A |
| 33 | | 0 A |

| NODE | BUS NAME | BUS VOLTS |
|---|---|---|
| V1 | | 0.000 |
| V2 | | 0.000 |
| V3 | | 0.000 |
| V4 | | 0.000 |
| V5 | | 0.000 |
| V6 | | 0.000 |
| V7 | | 0.000 |
| V8 | | 0.000 |
| V9 | | 0.000 |
| V10 | | 0.000 |
| V11 | | 0.000 |
| V12 | | 0.000 |
| V13 | | 0.000 |
| V14 | | 0.000 |
| V15 | | 0.000 |
| V16 | | 0.000 |
| V17 | | 0.000 |
| V18 | | 0.000 |
| V19 | | 0.000 |
| V20 | | 0.000 |
| V21 | | 0.000 |
| V22 | | 0.000 |
| V23 | | 0.000 |
| V24 | | 0.000 |
| V25 | | 0.000 |
| V26 | | 0.000 |
| V27 | | 0.000 |
| V28 | | 0.000 |
| V29 | | 0.000 |
| V30 | | 0.000 |
| V31 | | 0.000 |
| V32 | | 0.000 |
| V33 | | 0.000 |

| TIME NUMBER: | TIME 1 | TIME 2 | TIME 3 |
|---|---|---|---|
| BATTERY VOLTAGE: | | | |
| TIME: | | | |

| TOTAL.XLS | | TOTAL PANEL CURRENTS (AMPS) | TOTAL PANEL CURRENTS (AMPS) | TOTAL PANEL CURRENTS (AMPS) |
|---|---|---|---|---|
| PANEL NAME | PANEL NUMBER | | | |
| | PANEL 2 | | | |
| | PANEL 3 | | | |
| | PANEL 4 | | | |
| | PANEL 5 | | | |
| | PANEL 6 | | | |
| | PANEL 7 | | | |
| | PANEL 8 | | | |
| | PANEL 9 | | | |
| | PANEL 10 | | | |
| | PANEL 11 | | | |
| | PANEL 12 | | | |
| | PANEL 13 | | | |
| | PANEL 14 | | | |
| | PANEL 15 | | | |
| | PANEL 16 | | | |
| | PANEL 17 | | | |
| | PANEL 18 | | | |
| | PANEL 19 | | | |
| | PANEL 20 | | | |
| | PANEL 21 | | | |
| | PANEL 22 | | | |
| | PANEL 23 | | | |
| | PANEL 24 | | | |
| | PANEL 25 | | | |
| | PANEL 26 | | | |
| | PANEL 27 | | | |
| | PANEL 28 | | | |
| | PANEL 29 | | | |
| | PANEL 30 | | | |
| | PANEL 31 | | | |
| | PANEL 32 | | | |
| | PANEL 33 | | | |
| | TOTALS: | | | |

| TOTAL.XLS | | PANEL VOLTAGES (VOLTS) | PANEL VOLTAGES (VOLTS) | PANEL VOLTAGES (VOLTS) |
|---|---|---|---|---|
| PANEL NAME | PANEL NUMBER | | | |
| | PANEL 2 | | | |
| | PANEL 3 | | | |
| | PANEL 4 | | | |
| | PANEL 5 | | | |
| | PANEL 6 | | | |
| | PANEL 7 | | | |
| | PANEL 8 | | | |
| | PANEL 9 | | | |
| | PANEL 10 | | | |
| | PANEL 11 | | | |
| | PANEL 12 | | | |
| | PANEL 13 | | | |
| | PANEL 14 | | | |
| | PANEL 15 | | | |
| | PANEL 16 | | | |
| | PANEL 17 | | | |
| | PANEL 18 | | | |
| | PANEL 19 | | | |
| | PANEL 20 | | | |
| | PANEL 21 | | | |
| | PANEL 22 | | | |
| | PANEL 23 | | | |
| | PANEL 24 | | | |
| | PANEL 25 | | | |
| | PANEL 26 | | | |
| | PANEL 27 | | | |
| | PANEL 28 | | | |
| | PANEL 29 | | | |
| | PANEL 30 | | | |
| | PANEL 31 | | | |
| | PANEL 32 | | | |
| | PANEL 33 | | | |

DETERMINATION OF LOAD FLOW IN DIRECT CURRENT ELECTRICAL SYSTEMS

BACKGROUND OF THE INVENTION

The present invention relates generally to the analysis of electrical networks, and more particularly, to the analysis of DC electrical load flow.

In large manufacturing or process facilities, electrical power is often provided by diverse, AC and DC networks. In a nuclear power plant, for example, a DC power supply operates equipment and components, during both normal and accident conditions. A large, for example, 60 cell station battery, provides DC power to a DC distribution panel. During normal operation, the DC panel provides power to the station computer, AC switchgear, motor operated valves, AC/DC inverter equipment and similar components. Control power to operate the Diesel Generator and associated breakers is supplied from the DC system.

DC system reliability is of growing concern, as loads continue to be added to existing systems. The loads being supplied from DC systems are often critical loads for which operability is sensitive to the supply voltage. For these reasons, it is important to perform load flow, voltage drop and short circuit analysis on these DC systems to verify system adequacy and enable the user to know where any system limitations exist.

Conventionally, DC network analysis was performed using simplified modeling techniques. Load currents were calculated based on a single assumed value of the voltage, dependent on the load type. One problem with this approach, is that it assumes a static voltage and thus a static current value for the loads during the entire battery discharge time. In reality, the system voltage typically changes with time, by 10% to 25%. As the voltage changes, the load currents are also changing. For constant impedance loads (lights, relays, etc.) the current decreases as the voltage decreases. For constant power loads (inverters, motors, etc.) the current increases as the voltage decreases.

In one form of conventional modeling, an analytical tool which is designed for an analysis of an AC network, is "fooled" so as to appear as a DC network. To this extent, DC models have utilized significant simplifications resulting in limited accuracy. For example, in tools originally designed to analyze a three phase AC power distribution network, the model was "fooled" by, for example, setting the power factor to 1.0, and dividing the results by the square root of 3. These models suffered from the further deficiencies noted above, of failing to accommodate the time dependence of the source voltages.

Another known model is based on analysis using a voltage divider network. Instead of explicitly analyzing the entire network, the network is simplified to a few branches which are explicitly analyzed, and conditions for the individual components are estimated. This also results in forcing the program/user to utilize separate networks for load flow and fault current calculations.

The prior analytical tools are typically implemented by custom computer programs written in a language such as BASIC, FORTRAN or C. These do not permit the user to compute and visually comprehend, the time dependent affects on the network. This time dependence can simply be a result of the battery being drawn down, with or without changes in the state of elements in the network. For example, many DC loads in the plant are subject to sequencing, with rapid switching between on and off, over a period ranging from milliseconds to minutes. Moreover, certain sequences of load activation are assumed to occur during various fault or accident scenarios. Conventional analytical tools are not adapted to handle the time dependence of the voltage source, with the ability to analyze a comprehensive sequence of constant power and/or constant impedence type loading during such time.

As a result, the conventional techniques for analyzing DC electrical load flow, may indicate that a particular network is either overly conservative or has insufficient margin relative to the licensing or other margin requirements, when in fact the system is quite satisfactory.

SUMMARY OF THE INVENTION

It is, accordingly, an object of the present invention to provide a method and apparatus for modeling the elements of a DC network and predicting important network characteristics, while avoiding many of the unnecessary simplifications and conservatisms inherent in conventional apparatus and methods.

It is a more particular object of the invention, to provide a method and apparatus by which all cables, nodes and devices are explicitly modeled, and in which separate fault current and voltage drop resistance values for each element can be predicted.

It is a further object to provide method and apparatus, in which each device in the network can be modeled as having an open or closed switch, that can be toggled to model an arbitrary load sequence in a network.

It is another object to provide method and apparatus of the foregoing type in which each load can be explicitly characterized as either constant power or constant impedance, and in which a panel board having several loads, can be explicitly modeled.

It is a further object that the model in such apparatus and method represent short circuit equivalent impedances, and accommodate the effect of variable operating temperatures on cable impedances.

It is yet another object that the method and apparatus permit modeling of multiple time intervals for different panel loading, and explicitly model the dynamic voltage of a battery due to its load profile during its discharge period.

It is yet another object that the network and permit fault calculations utilize the same network as used for the load flow calculations.

An important further object of the invention, is to provide method and apparatus for the user to visualize the configuration of the network and the effects of time and load profile, on the important network characteristics.

At a very broad level, the present invention is directed to a system and method which utilizes a spreadsheet computer program having linked files in which the network architecture and the network element properties are entered and stored by the user. The overall network configuration information is input into a fist, (INPUT) file type, which includes general parameters such as the battery terminal voltage, cable temperatures, bus (or node) names and bus interconnection information such as cable sizes and number of conductors per node. Cable impedance tables based on NEC and EPRI values as well as a blank table for easy customization are available in second, auxilliary (RESIST)

file. Detailed loading information is entered on a third, (PANEL) file, which includes load description, load type (constant power or constant impedance), load rating data and load status (on or off). The PANEL loading data can be sequenced over time.

A user interface, preferably through a mouse, keyboard and display screen, presents the user with tabular input formats that can readily receive the input data for the INPUT and PANEL files. These spreadsheets, or files, work together to automatically set up the appropriate YBUS admittance matrix file and interactively compute voltages and currents using fourth type (CALC) files. Thus, the computed currents are based on the actual computed node voltages. This allows for the removal of unnecessary conservatism and provides a more accurate representation of the DC network.

The loads are easily toggled ON and OFF and the battery terminal voltage can be changed to allow for analysis at specific points of time within the battery load profile. This allows for additional detailed review of the time dependent computed values of bus voltages and currents as stored in the TOTALS file.

Preferably, the system and method include a graphics display module (1 LINE) which generates a one line diagram on the display screen, along with the results of the load flow calculations. Node voltages appear on the single line diagram and are automatically updated as the values are recomputed. Likewise, the results of the fault current computations are also displayed on a single line diagram of the network. The available fault current values are shown for each node. This gives the user all of the pertinent information in one easy to read location.

In accordance with the invention, once the network architecture is stored in the files, the user can change the initial battery voltage, loads, and load sequencing. Dozens of time intervals following the initial condition can be modeled with or without sequencing of on/off load switches. The computation at each time interval, is based on the results of the computation for the prior time interval, including the effects of drain on the source battery. Moreover, the battery drain and/or recharging characteristics can be explicitly modelled. In essence, an infinite variety of scenarios can be explicitly modeled and visualized.

In a particularly advantageous embodiment of the invention, the short circuit fault current at each node is determined from the computation of prefault voltages which are based on the same network and load fow computations for a given time point in the load profile modelling. The invention takes into account the resistance of the remainder of the network, as each node is assumed, on an individual basis, to be faulted. As a result, the fault current at each bus associated with the network profile at each time point, can be determined. Each bus has associated therewith a circuit breaker which has a rated current capacity. The user can thus compare the fault current at each bus, at each time point during the profile, with the rated capacity associated with each circuit breaker, thus assuring that no circuit breaker is at risk of catastrophic failure under any network time profile scenarios.

BRIEF DESCRIPTION OF THE DRAWINGS

These and other objects and advantages of the invention will become more evident from the following description of the preferred embodiment, taken with reference to the accompanying drawings, in which:

FIG. 1 is a schematic diagram showing the relationship of the data and computation files in accordance with the preferred embodiment and FIG. 1A is a tabulation of the data transfer occurring between the data and computation files shown in FIG. 1;

FIG. 4 is a reproduction of the visual image of a portion of the INPUT spreadsheet as would appear on the monitor;

FIG. 5 is another portion of the INPUT spreadsheet as would appear on the monitor;

FIG. 6 is another portion of the INPUT spreadsheet as would appear on the monitor;

FIG. 7 is another portion of the INPUT spreadsheet as would appear on the monitor;

FIG. 8 is a portion of the RESIST spreadsheet as would appear on the monitor;

FIG. 9 is another portion of the RESIST spreadsheet as would appear on the monitor;

FIG. 10 is another portion of the RESIST spreadsheet as would appear on the monitor;

FIG. 14 represents a portion of the image associated with the PANELS spreadsheet as would appear on the monitor;

FIG. 15 is another portion of the PANELS spreadsheet as would appear on the monitor;

FIG. 19 is another portion of the PANELS spreadsheet;

FIG. 20 is a portion of the SCCALC spreadsheet on which the results of the fault current computation can be presented to the user on the monitor;

FIG. 21 is a portion of the VDCALC spreadsheet or SCCALC spreadsheet, on which the node (bus) voltages are presented to the user on the monitor;

FIG. 23 is a portion of the TOTALS spreadsheet, on which the time dependent panel currents are present to the user on the monitor;

FIG. 24 is a portion of the TOTALS spreadsheet on which the time dependent panel voltages are presented to the user on the monitor.

DESCRIPTION OF THE PREFERRED EMBODIMENT

Methodology

Figure 1:
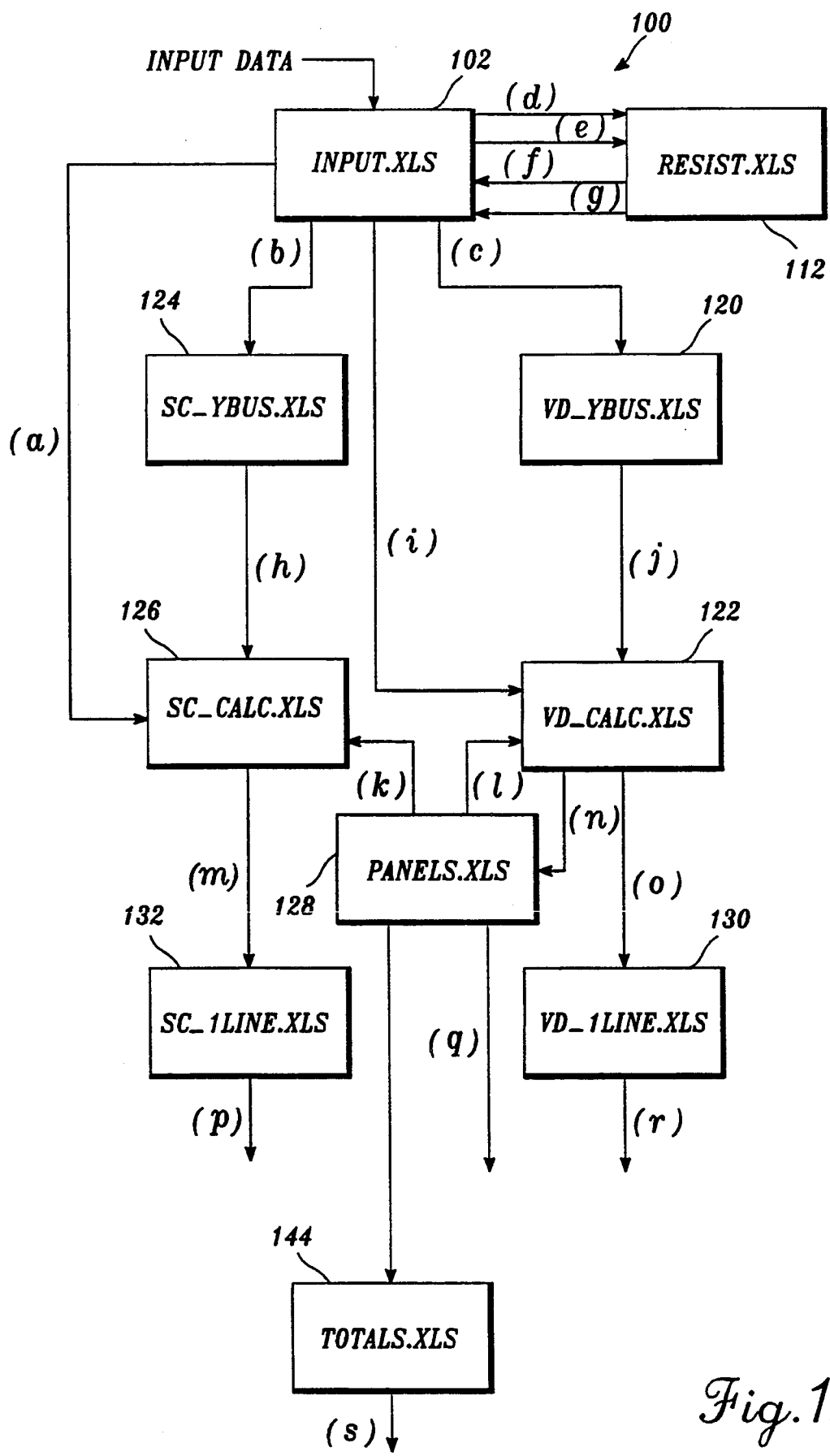

The invention performs the loading analysis on a DC system using the Gauss-Seidel iterative technique to perform load flow calculations. The Gauss-Seidel method solves for all unknown bus voltages on a specified system while at least one bus voltage on the system remains constant. This constant voltage bus is identified as the system "Swing Bus". The user-entered system configuration and load data is converted into a load flow admittance matrix or $Y_{bus}$. The iterative calculations are then performed to solve for the unknown bus voltages at each node on the system model. The Gauss-Seidel iterative technique requires that each load on the system be modeled either as a constant power or constant impedance (resistance for DC) load. A constant power load is modeled with the current inversely proportional to the voltage. A constant impedance load is modeled with the current directly proportional to the voltage.

The technique described above is used on the same network model for calculating the bus voltages for voltage drop calculations and the prefault bus voltages for short circuit calculations. However, the load flow $Y_{bus}$ for each type of calculation is different. This invention is designed to be used on a DC system using the battery as the constant voltage or "Swing Bus". In short circuit calculations the battery charger bus is also considered to be a constant voltage bus.

The load flow admittance matrix ($Y_{bus}$) used in voltage drop calculations is equal to the sum of the cable admittance matrix and the shunt admittance matrix. The cable admittance matrix is based on the user defined bus connections and the user defined cable temperature to be used for voltage drop calculations. The shunt admittance matrix is based on the user defined constant impedance loads connected to the system. The bus voltages calculated account for the voltage drop in both the positive and negative conductors. The input data include:

Bus names
Cable temperature
Battery voltage
Time data
System configuration data: bus connections, cable lengths, # of parallel conductors, and cable sizes
Bus load data: load descriptions, load types, and load values The output generated include:
Bus Voltages
Corrected load currents The load flow admittance matrix ($Y_{bus}$) used in short circuit calculations is equal to the sum of the cable admittance matrix and the shunt admittance matrix. The cable admittance matrix is based on the user defined bus connections and the user defined cable temperature to be used for short circuit calculations. The shunt admittance matrix is based on the user defined constant impedance loads connected to the system. The bus prefault voltages calculated account for the voltage drop in both the positive and negative conductors.

The short circuit current available at each bus on the system is determined using an application of Thevenin's theorem. First, the bus impedance matrix ($Z_{bus}$) is found by taking the inverse of the fault contributing admittance matrix ($Y_{bus}$). The user is given the option of choosing whether the fault contributing admittance matrix is calculated using one-way or two-way cable impedances. The one-way cable impedance is used as the default setting since the resulting calculations are more conservative when a zero impedance return path is assumed. If the DC system being analyzed is grounded, the user should not assume that the return fault path is through the cable (one-way cable impedance should be used). If the DC system being analyzed is ungrounded, the user may choose to assume that the two-way cable impedance will be in the fault path. The principal diagonal of the $Z_{bus}$ contains the Thevenin equivalent impedance values of the network for calculating fault current at the various buses. The fault current at a given bus is calculated by dividing the bus prefault voltage, by the Thevenin equivalent impedance of the network at the desired bus (i.e., At bus number n, I short circuit $= Vn/Znn$, where Vn is the bus prefault voltage and $Z_{nn}$ is the impedance value from the $Z_{bus}$ matrix). The values that are calculated for short circuit fault current at each bus include the contributions of all fault contributing components connected to the system buses. The buses that have fault contributing components connected to them are identified on the input sheet as having a fault contributing equivalent impedance value.

The input data include:
Bus names
Fault contributing equivalent impedance at each bus
Cable temperature
Battery voltage
Battery charger voltage
Battery charger fault limiting current
System configuration data: bus connections, cable lengths, # of parallel conductors, and cable sizes
Bus load data: load descriptions, load types, and load values The output data include:
Prefault voltage at each bus
Short circuit fault current at each bus

Configuration

Figure 2:
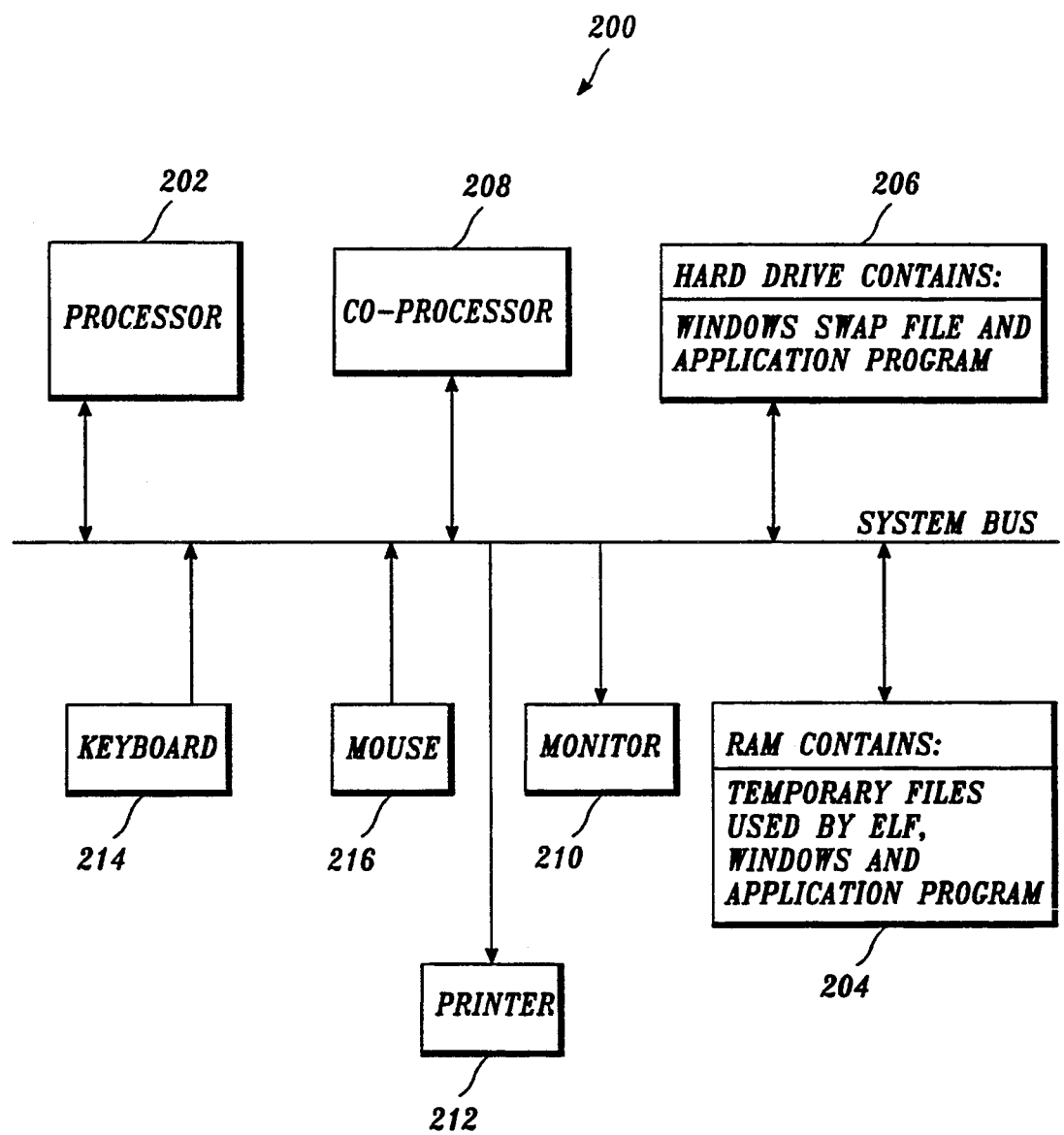
FIG. 2 is a schematic representation of the hardware configuration associated with the spreadsheet files shown in FIG. 1.

The overall file structure and data flow 100 in accordance with the preferred apparatus and method of the present invention, are shown in FIG. 1. The data flow 100 is illustrated with lines terminated by arrow heads. The actual data transferred is described in the tabulation in FIG. 1A. In particular, each data flow line is accompanied by a reference letter. The reference letters are tabulated in FIG. 1A along with the associated data that is transferred along the referenced data flow line. The hardware configuration 200 preferably utilized to implement the invention, is shown in FIG. 2. Hereinafter the invention will also be referred to as the electrical load flow system, on "ELF".

The invention as described herein is embodied in an IBM-PC compatible computer that can support Microsoft ® Windows ™ version 3.1 operating system and Microsoft ® Excel ™ version 4.0 spreadsheet programs. The following listing is the recommended IBM-PC system configuration:

An 80386 processor 202 (or higher)
A minimum of 4 megabytes of random access data storage memory 204
A hard drive 206 with a minimum of 8 megabytes data storage space A Windows ™ "swap file" (used as virtual memory) should be configured, as recommended in the Windows ™ setup procedure An 80387 math co-processor 208

A display device (monitor) 210 that is supported by Microsoft ® Windows ™

A printer 212 that is supported by Microsoft ® Windows ™

A user input device (keyboard 214 and mouse 216) that is supported by Microsoft ® Windows ™

Figure 3:
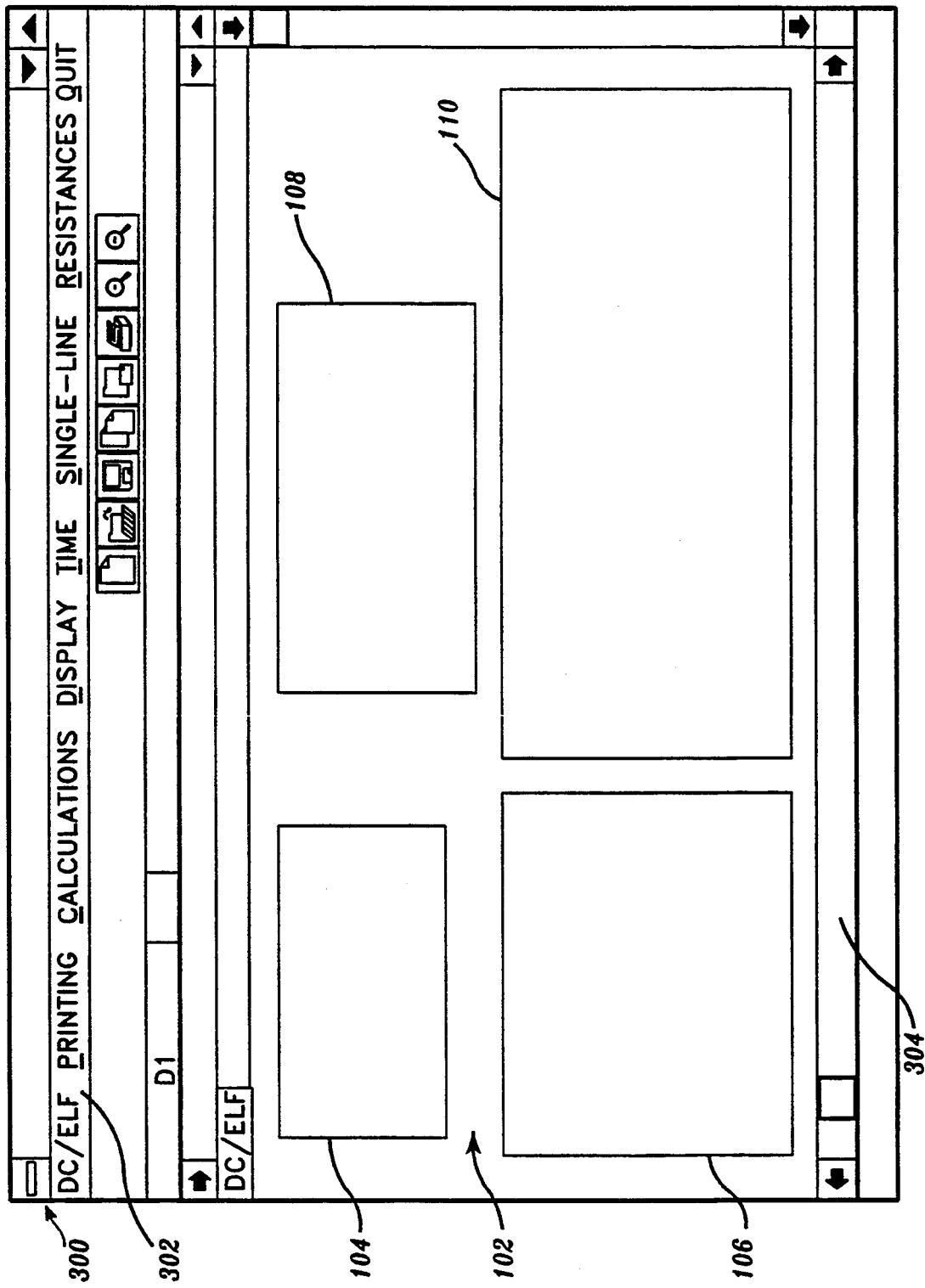
FIG. 3 is the main, or reference user interface window visible on the monitor of the configuration shown in FIG. 2.

The user opens the program ELF, and is presented with the image of the main input window 300 such as shown in FIG. 3. A custom menu bar 302 allows the user to execute the program macros that perform specific functions on spreadsheets. The custom menu bar is automatically displayed when the program is started and it consists of the following seven headings:

Printing
Calculations
Display
Time
Single-Line
Resistances
Quit

The status bar 304 at the bottom of the window displays a message describing the function of each one of the commands on the menu bar. These status bar messages can be viewed by selecting and holding the mouse button in, on each individual menu command.

Printing
Main Input Data—prints panel connection input data
Resistance Data—prints both resistance table
Panel Loading Data—prints panel loading data for individual panels
Short Circuit Results—prints calculated short circuit currents and prefault voltages at each panel
Short Circuit Single-Line—prints single-line drawing with calculated short circuit currents identified at each panel
Voltage Drop Results—prints calculated voltages at each panel
Voltage Drop Single-Line—prints single-line drawing with calculated voltages identified at each panel
All Panel Current Totals—prints calculated panel load currents for each "Time" evaluated
All Panel Voltages—printed calculated panel voltages for each "Time" evaluated
Calculations
Short Circuit—starts short circuit calculations
Short Circuit Reset—resets short circuit calculations
Voltage Drop—starts voltage drop calculations at a single instant in "Time"
Voltage Drop Reset—resets voltage drop calculations at a single instant in "Time"
Multiple "Time" Voltage Drop—starts multiple voltage drop calculations over a "Time" range
Display
Main Input—displays the main input sheet
Resistance Tables—displays the resistance tables sheet
Panel Loading—displays the panel loading sheet
Short Circuit Single-Line—displays the short circuit single-line drawing
Voltage Drop Single-Line—displays the voltage drop single-line drawing
Multiple "Time" Summary—displays the multiple voltage drop calculations over a "Time" range summary sheet
Clear Multiple "Time" Summary—clears the values stored in the "Time" range summary sheet
Time
Add Time Data—saves the load toggle settings and the battery terminal voltage at a given instant in time, as a "Time number" (1–40)
Show Stored Time Data—displays the load toggle settings and the battery terminal voltage at a given instant in time, of a previously stored "Time number" (1–40)
Clear Existing Time Data—clears the load toggle settings and the battery terminal voltage at a given instant in time, of a previously stored "Time number" (1–40)
Single-Line
Edit Voltage Drop Single-Line—unprotects the voltage drop single-line drawing and displays all of the necessary graphical objects for editing
Protect Voltage Drop Single-Line—protects the voltage drop single-line drawing after editing is completed
Create Short Circuit Single-Line—creates the short circuit single-line drawing from the completed voltage drop single-line drawing
Resistances
Add New-Line—adds a new blank line at the top of both the short circuit and voltage drop resistance tables
Sort Tables—sorts both the short circuit and voltage drop resistance tables after any name designation changes or line additions
Quit
Save All—saves all of the open ELF files
Exit—closes all ELF files and exits the program Spreadsheet (FIG. 1)

Main Input Spreadsheet (INPUT.XLS)

The INPUT.XLS spreadsheet 102 is the main input spreadsheet. On this spreadsheet, which has four portions 104,106,108 and 110, the user enters the bus information and cable connection data for the system being analyzed. There are two types of fields indicated within box 104 on the INPUT.XLS spreadsheet: The first type of field is the User Input field which is identified on the spreadsheet with heavy cell bordering (Blue cell bordering on a color monitor). Data can be entered, edited and deleted in a User Input field. The second type of field is the Fixed field which is identified on the spreadsheet with thin cell bordering or no cell bordering. Data cannot be entered, edited, or deleted in a Fixed field. The Fixed fields on the spreadsheet are protected to prevent inadvertent data entry or editing that could overwrite formulas.

Bus Name is the user defined name given to a system bus or node (see FIG. 4). A Bus (or node) is usually defined as a point on the electrical distribution system that serves as a common connection for two or more circuits (e.g., battery, battery charger, main distribution panel, secondary distribution panels, auxiliary panels, control panels, motor control centers, motor terminals, inverter terminals, and switch-gear control centers). Each bus is thus defined by a node having one input cable and at least one output cable. The name given to each bus should be unique since it will be used to identify the bus on the associated calculation spreadsheets as well as on the system single-line drawing. The Bus Name field is required for both short circuit and voltage drop calculations.

Bus number 1 and bus number 3 are defined in the following manner: Bus number 1 is defined as the "Swing Bus" for the system being analyzed. This bus voltage is held constant and is equal to the user entered battery voltage for both the short circuit and voltage drop calculations. Bus number 3 is defined as the "CHARGER BUS" for the system being analyzed. This bus voltage is also held constant in short circuit calculations and is equal to the user entered battery charger voltage.

The "Fault contributing equivalent impedance at the bus" column in FIG. 4 is for the user to input the Thevenin equivalent impedance (in ohms), of each system component, that contributes to fault current (e.g., battery, battery charger, and DC motors). After the user calculates the equivalent impedance of a given component, this calculated value is entered at the bus where the component is located. If more than one fault contributing component exists at a bus, then the parallel combination of the individual equivalent impedances of each device must be calculated and entered at the bus where the components are located. This field is required for short circuit calculations and is not required for voltage drop calculations. The Thevenin equivalent impedance of the battery charger (Bus 3) is automatically calculated from the charger voltage and charger fault limiting current.

As shown in FIG. 5, short circuit information is entered concerning two-way cable length for resistances (Yes/No). This is a user entered field which changes the type of short circuit calculation being performed. If [No] is selected, the calculations are performed assuming a zero impedance return fault path (one-way cable length). If [Yes] is selected, the calculations are performed assuming a return fault path through the cable (two-way cable length). The results obtained using the one-way cable length are more conservative than those obtained using two-way lengths. If the DC system being analyzed is grounded, the user should not assume that the return fault path is through the cable and [No] should be entered in this field.

The Cable Temperature field permits the user to define the short circuit cable temperature in °C. The spreadsheet uses this cable temperature to perform temperature correction calculations on the cable impedance values before they are used in short circuit calculations. The temperature chosen for conservative short circuit calculations should be the lowest potential cable temperature. The lowest cable temperature is conservative since cable impedance decreases as temperature decreases which results in increased values of calculated fault currents throughout the system.

The Battery Voltage at t=0− field permits the user to define the battery terminal voltage (in volts) at the instant in time just prior to a system fault occurring. The spreadsheet uses this battery terminal voltage to calculate the prefault bus voltages to be used in short circuit calculations. The voltage chosen for conservative short circuit calculations should be the highest potential battery terminal voltage at t=0−. The highest battery terminal voltage is conservative since an increase in calculated prefault bus voltages results in an increase in the calculated short circuit currents.

The Charger Voltage at t=0− is a user entered field which defines the battery charger terminal voltage (in volts) at the instant in time just prior to a system fault occurring. The spreadsheet uses this battery charger terminal voltage to calculate the prefault bus voltages to be used in short circuit calculations. The voltage chosen for conservative short circuit calculations should be the highest potential battery charger terminal voltage at time t=0−. The highest battery charger terminal voltage is conservative since an increase in calculated prefault bus voltages results in an increase in the calculated short circuit currents. The Charger Fault Limiting Current is a user entered field which defines the fault limiting current (in amps) that the battery charger is capable of providing. The spreadsheet uses this fault limiting current to calculate the fault contributing equivalent impedance to be used for short circuit calculations. For conservative short circuit calculations, the fault limiting current chosen should be the highest rated value specified in the battery charger technical specifications.

The Cable Temperature is a user entered field which defines the voltage drop cable temperature in °C. The spreadsheet uses this cable temperature to perform temperature correction calculations on the cable impedance values before they are used in voltage drop calculations. The temperature chosen for conservative voltage drop calculations should be the highest potential cable temperature. The highest cable temperature is conservative since cable impedance increases as temperature increases. Higher cable impedance results in lower calculated bus voltages throughout the system.

The Time Number is a user entered field, however, this field is not entered on the INPUT.XLS spreadsheet. The values for this field are selected on the panel load spreadsheet PANEL.XLS. The latest value that is selected on the panel load spreadsheet is displayed on the INPUT.XLS spreadsheet for information only. This field defines the time number (1–40) that the battery terminal voltage and load toggle settings represent. This field only has meaning for voltage drop calculations since the short circuit calculations performed represent the worst case condition regardless of time.

The Battery Voltage at 0 min. is a user entered field, however, this field is not entered on the INPUT.XLS spreadsheet. The values for this field are entered on the panel load spreadsheet PANELS.XLS. The latest value that is entered on the panel load spreadsheet is displayed on the INPUT.XLS spreadsheet for information only. This field defines the battery terminal voltage (in volts) at a particular instant in time. The spreadsheet uses this battery terminal voltage to set the "Swing Bus" voltage to be used in the voltage drop calculations at that particular instant in time. The voltage chosen for conservative voltage drop calculations should be the lowest potential battery terminal voltage at that time. The lowest battery terminal voltage is conservative since all of the voltages on the system decrease when the source voltage decreases.

Time is a user entered field, however, this field is not entered on the INPUT.XLS spreadsheet. The values for this field are entered on the panel load spreadsheet PANEL.XLS. The latest value that is entered on the panel load spreadsheet is displayed on the INPUT.XLS spreadsheet for information only. This field defines the instant in time (in minutes) that the battery terminal voltage information is valid. The time entered in this field also represents the time on the load profile that the entered load toggle data is valid. This field only has meaning for voltage drop calculations since the short circuit calculations performed represent the worst case condition regardless of time.

FIGS. 5, 6 and 7 show spreadsheet portions 110 of FIG. 3 in to parts, 110a and 110b. Toggle (1=closed, 0=open) is a user entered field which determines if the bus connection defined in a given row is closed (1) or open (0) at a particular instant in time. The spreadsheet only uses this toggle field in voltage drop calculations. This field allows the user to temporarily disconnect a bus from the system model without having to delete the cable data associated with that bus connection. The bus connections in short circuit calculations are always closed and the toggle field has no effect on these calculations. The closed setting for short circuit calculations ensures that the fault currents calculated are based on all fault. The toggle field is required for voltage drop calculations and is not required for short circuit calculations.

If a bus that feeds other downstream buses is toggled to "0" to disconnect it from the system model, then each of the downstream buses should also be toggled to "0" to ensure that the system is modeled correctly.

The Bus Connections (From Bus#, To Bus#) are user entered fields which identify the bus connections of the system to be modeled. The fixed Bus numbers (1 through 33) corresponding to the user entered bus names at 106, are entered in these fields (see FIG. 4). These fields are required for both short circuit and voltage drop calculations.

The Cable Length (one direction) is a user entered field for cable length (in ft) between the From Bus and the To Bus identified in the Bus Connections fields. The length required by the spreadsheet is the length of one conductor either positive or negative in one direction (e.g., 29' from bus 2 to bus 3). If the positive conductor length is entered, the spreadsheet assumes an equal length for the return path (negative conductor). This field is required for both short circuit and voltage drop calculations.

The # of Parallel Conductors (one direction) is a user entered field for the number of conductors in parallel between the From Bus and the To Bus identified in the Bus Connections fields. The spreadsheet requires the number of conductors either positive or negative, not both, in one direction (e.g., The number 2 would be entered in the # of Parallel Conductors (one direction) field for bus connections that have 2 positive conductors and 2 negative conductors). The spreadsheet assumes an equal number of parallel conductors for both positive and negative conductors. This field is required for both short circuit and voltage drop calculations.

The Cable letter designation is a user entered field that corresponds to the cable size to be selected from the cable resistance look-up table 112 (RESIST.XLS)(-see FIG. 1). The spreadsheet assumes that the positive and negative conductors are the same size for a given bus connection. The letter designation field is required for both short circuit and voltage drop calculations.

The remaining fields on the INPUT.XLS spreadsheet (see FIG. 7) are fixed fields that are calculated automatically. The descriptions of the values displayed in each of these fields are as follows:

Wire Size (AWG) or (kcmil) is updated with the wire size (in AWG or kcmil) that corresponds to the cable letter designation selected. This field is used in voltage drop and short circuit calculations. This field is automatically updated each time that calculations are executed.

The (Short Circuit) R @ °C. (ohms/1000') cable resistance is displayed in this field. This value is based on the wire size selected and the previously entered short circuit cable temperature. This fixed field is updated from the resistance look-up table each time the user executes either the voltage drop or short circuit calculations.

The (Short Circuit) R @ °C. (ohms) actual cable resistance displayed in this field is based on the cable length, # of parallel conductors, and the short circuit cable resistance per 1000 ft. The short circuit calculations use this resistance value. This fixed field is calculated each time the user executes either the voltage drop or short circuit calculations. The following formula is used to calculate this field:

$$R_{actual} = 2 \times \frac{(L)}{(C)} \times \frac{(R/1000')}{(1000)}$$

Where:
$R_{actual}$ = The actual cable resistance (in ohms)
L = The cable length (in ft., in one direction)
C = The number of conductors (in one direction)
$R_{1000'}$ = The cable resistance (in ohms per 1000 ft)

Although a factor of two is included in the above formula, the one way cable length is used to determine the Thevenin equivalent impedance of each fault path in the short circuit calculations. The factor of two, in the above formula is only used to calculate the prefault bus voltages for the system.

The (Voltage Drop) R @ °C. (ohms/1000') cable resistance per 1000 ft is also displayed in FIG. 6). This value is based on the wire size selected and the previously entered voltage drop cable temperature. This fixed field is updated from the resistance look-up table each time the user executes either the voltage drop or short circuit calculations.

The (Voltage Drop) R @ °C. (ohms) actual cable resistance displayed in this field is based on the cable length, # of parallel conductors, and the voltage drop cable resistance per 1000 ft. The voltage drop calculations use this resistance value. This fixed field is calculated each time the user executes either the voltage drop or short circuit calculations. The immediately preceding formula is also used to calculate this field.

Cable Resistance Look-Up Tables (RESIST.XLS)

The cable resistance look-up tables for voltage drop and short circuit calculations are both on a single spreadsheet 112 having three portions 114, 116, 118 (see FIGS. 1, 8, 9 and 10). There are three options for these resistance look-up tables. The first spreadsheet option has the file name RESIST.NEC. and the second spreadsheet option has the file name RESIST.EPR (not shown). The third option (not shown) allows the user to customize one of the first two options. For each option, FIG. 8 defines the form of the cable resistance values to be used in short circuit analysis and FIG. 9 defines the form of the cable resistance values to be used in voltage drop analysis. The user can change which resistance tables are used, by replacing the file named RESIST.XLS in the directory. For example, if the file name RESIST.NEC is copied to the directory and it is renamed RESIST.XLS, then calculations performed in the program will use the NEC resistance tables. The resistance tables spreadsheet (RESIST.XLS) is automatically opened after the "Continue" button is selected on the ELF title sheet (FIG. 3).

The initial values assigned in each of the tables in the RESIST.NEC spreadsheet are based on the 1990 National Electrical Code (Chapter 9, Table 8). The formula used for calculating temperature correction is also from the 1990 National Electric Code (Chapter 9, Table 8).

Temperature correction equation is:

$$R_2 = R_1[1 + a(T_2 - 75° C.)]$$

Where:
$R_1$ = The cable resistance at 75° C. (in ohms)
$R_2$ = The corrected cable resistance at $T_2$°C. (in ohms)
a = Resistance constant (0.00323 for copper)
$T_2$ = The actual cable temperature (in °C.)

The initial values assigned in each of the tables in the RESIST.EPR spreadsheet (not shown) are based on the Electrical Power Research Institute (EPRI) standard (Power Plant Electrical Reference Series Book 4, Table 4.13, page 4–27). The formula used for calculating temperature correction is also from the EPRI standard.

The resistance tables can be customized and changed in several ways for various reasons. Although the NEC and EPRI standards for DC cable resistance can be used for most systems, there are some circumstances in which the user needs to be able to change the resistance tables (e.g., for modeling cables with aluminum conductors instead of copper). Cable designations, wire sizes, strandings (optional), and resistance values which can be changed by typing over the existing cell values. Changes to temperature correction equations can be performed by the user by using the standard formula format required by Excel TM, however, the file being changed must first be unprotected. The customized resistance look-up tables can then be saved to a file named with a different extension (e.g., RESIST.CUS).

By using the unique cable designations that are preassigned to each cable in the RESIST.NEC or RESIST.EPR spreadsheet (see FIG. 9), the user has the ability to select a specific cable size that connects two buses.

Admittance and Calculation Spreadsheets (YBUS.XLS, CALC.XLS).

The voltages for the voltage drop calculation are calculated using matrix and iterative calculation techniques. The matrices needed to perform the voltage drop calculation are located on the VD_CALC.XLS spreadsheet 122 (see FIG. 1).

Three separate Y-matrices are created automatically from the INPUT 102 and RESIST 112, and PANELS 128 spreadsheets:
Cable Y-Bus (CY),
Constant Z Load Y-Bus (CZLY),
Load Flow Y-Bus (Y).

Matrix CY is created with links to the Cable Y-Bus on the VD_YBUS.XLS spreadsheet 120. Matrix CZLY is created using input from the constant Z load data on spreadsheet PANELS.XLS. Matrix Y is equal to the additional of CY and CZLY.

The iterative technique used to execute the voltage drop calculations requires seed guesses for the bus voltages. Bus one (battery) voltage is linked to the battery voltage field on PANELS.XLS spreadsheet 128. After the initial run, the results for each bus from the previous are used as the seed value. These seed guesses are initialized and stored on the VD_CALC.XLS spreadsheet.

The prefault voltages for the short circuit current calculation are calculated using matrix and iterative calculation techniques. The matrices needed to perform the prefault voltage calculations are located on the SC_CALC.XLS spreadsheet 126.

Five separate Y-matrices are created automatically from the INPUT 102, RESIST 112, and PANELS 128 spreadsheets:
Cable Y-Bus (CY),
Constant Z Load Y-Bus (CZLY),
Load Flow Y-Bus (Y),
Fault Contributing Y-Bus (FCY)
Short Circuit Y-Bus (SCY)

Matrix CY is created with links to the cable Y-Bus on the SC_YBUS.XLS spreadsheet 124. Matrix CZLY is created using input from the constant Z load data on spreadsheet PANELS.XLS. Matrix Y is equal to the addition of CY and CZLY.

This methodology requires seed guesses for the bus voltages. These seed guesses are initialized and stored on the SC_CALC.XLS spreadsheet. Power values are read from INPUT.XLS and admittances from the matrix Y created on SC_YBUS.XLS.

Matrix FCY is created using input from the fault contributing impedance on spreadsheet INPUT.XLS. Matrix SCY is created by the matrix addition of Y and FCY.

A Z-Bus matrix is developed from the inversion of matrix SCY using the Excel matrix inversion command. The diagonal elements of the Z-Bus matrix are the Thevenin equivalent impedances of the system as seen from the faulted bus(es).

Fault current is calculated using the diagonal Z-Bus matrix elements, the prefault voltages, and utilizing Ohm's Law.

The SC_YBUS.XLS spreadsheet contains the Y-Bus Matrix that is used to calculate the prefault bus voltages for short circuit current calculations.

Single Line Diagram Spreadsheets (1LINE.XLS).

The voltage drop single-line drawing graphically displays the result of the most recently performed voltage drop calculations. However, the single-line is not necessary to perform these calculations since the same results are also displayed in the VD_CALC.XLS spreadsheet 122. The voltage drop single-line drawing VD_1LINE.XLS 130 is opened by selecting the command {Voltage Drop Single-Line} under the heading {Display} on the ELF custom menu bar (see FIG. 3). The connections between the buses on the system are updated automatically each time the single-line drawing is opened. If the voltage at a bus is equal to zero, the connection to that bus is shown in the open position. The voltages on all buses are updated each time the voltage drop calculation is performed. The single-line must be created by the user the first time that a new system configuration is entered. The single-line must also be edited by the user each time buses are added.

Figure 11:
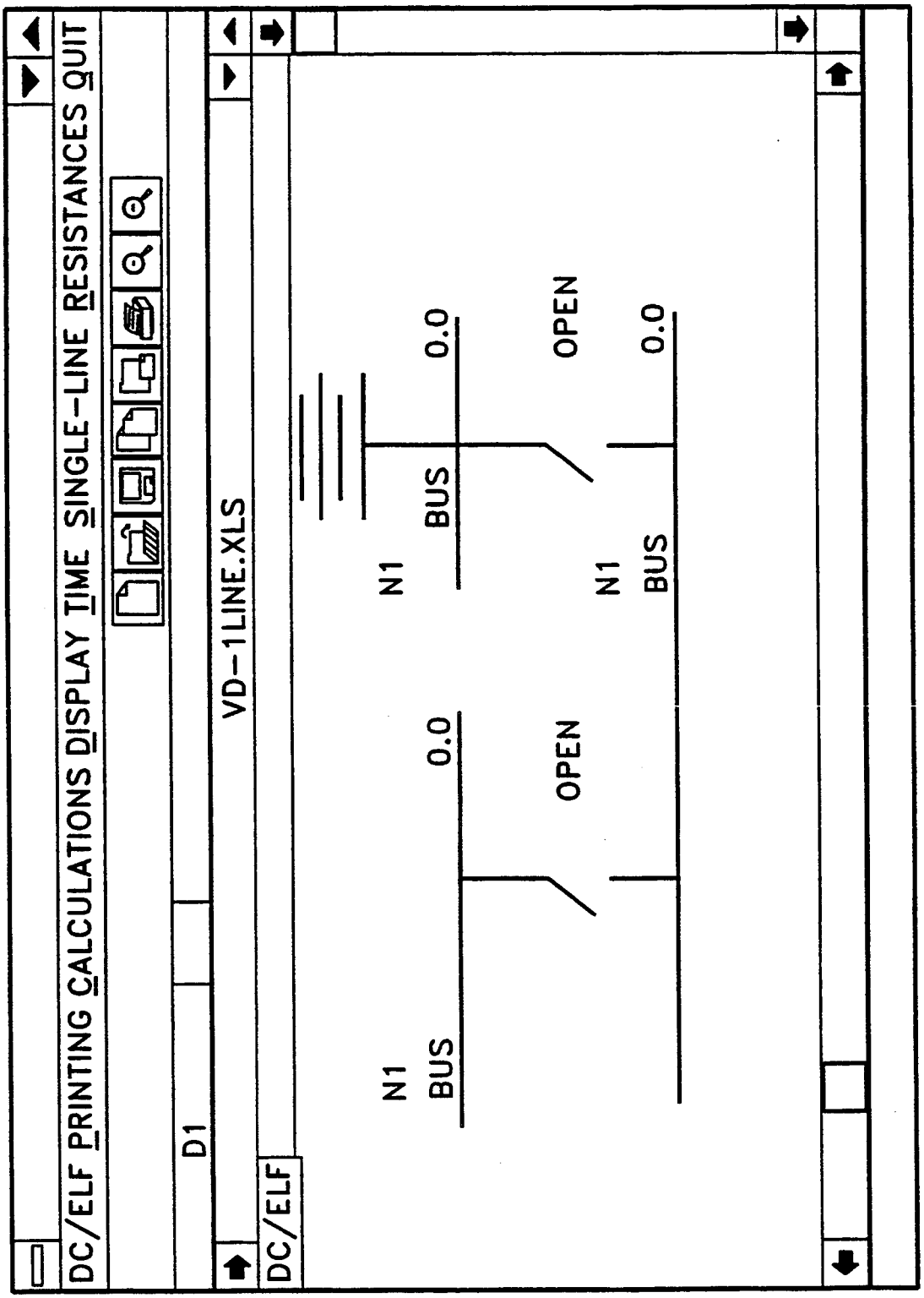
FIG. 11 is a reproduction of the one line diagram for the first three buses as would appear in the window image on the monitor, in connection with the user's instruction of a one-line diagram for the network.

The initial setup for the voltage drop single-line drawing is shown in FIG. 11. The three buses in this initial setup include a battery "Swing Bus" (N1), a main distribution bus (N2), and a battery charger "Swing Bus" (N3). Although, this initial configuration represents the starting point for most DC systems, this initial configuration can be edited by the user.

Figure 12:
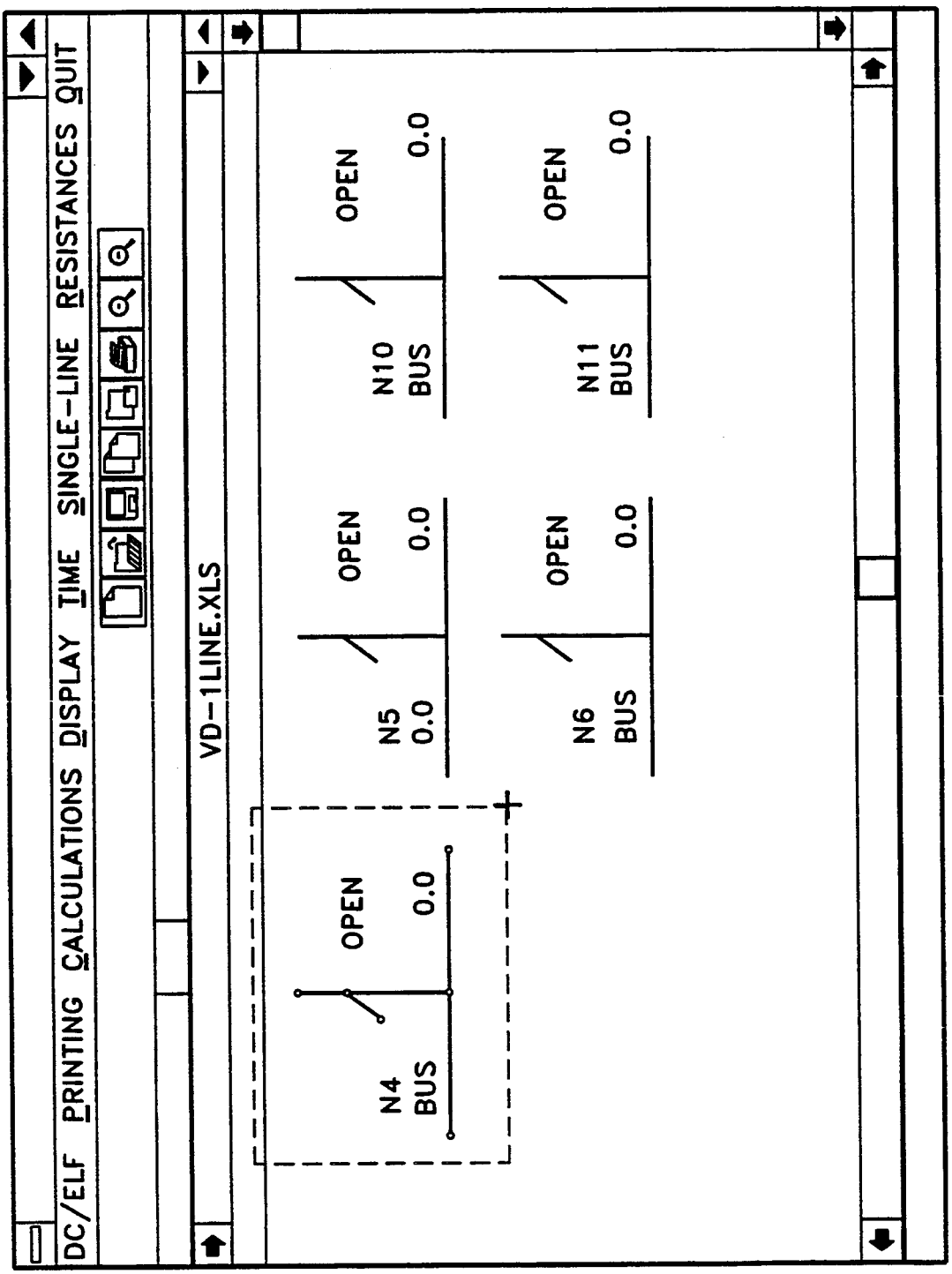
FIG. 12 is a reproduction of an image in the window of the monitor, during the process by which the user constructs a one-line diagram of the network.

The procedure for adding additional buses to a new or existing single-line drawing is described in the following steps:

1. After opening the VD—1LINE.XLS spreadsheet, select the command {Edit Voltage Drop Single-Line} under the heading {Single-Line} on the ELF custom menu bar. Selecting this command will unprotect the single-line drawing and display all of the graphical characters needed to edit the single-line drawing (including both the open and closed switch positions of all bus connections).
2. Scroll to the right in the same window and locate the additional buses which have already been drawn. Locate the bus to be added to the single-line drawing and select the graphical objects for the bus using the select tool from the button bar. For example: The graphical objects for bus #4 have been selected in FIG. 12. The select tool is the second button from the right on the DC/ELF custom tool bar.
3. The selected graphical objects can now be dragged with the mouse over to the single-line drawing by selecting the objects and holding the mouse button in while the objects are being moved.
4. Next the cells that were around the bus that was moved must also be moved so that the bus number, name, and voltage will be updated later. The cells can be highlighted, copied, and pasted to the single-line drawing. The copy tool is the fourth button from the left and the paste tool is the fifth button from the left, on the DC/ELF custom tool bar.
5. Finally, the objects that were moved over in step 3 can again be selected and repositioned to align them with the cells that were pasted in step 4.

When more than one bus is fed from an upstream bus, the line representing the upstream bus can be lengthened by first selecting the line and then dragging the end to be lengthened to the desired length. The line will remain straight if the "shift" key is held down while lengthening the line.

Figure 13:
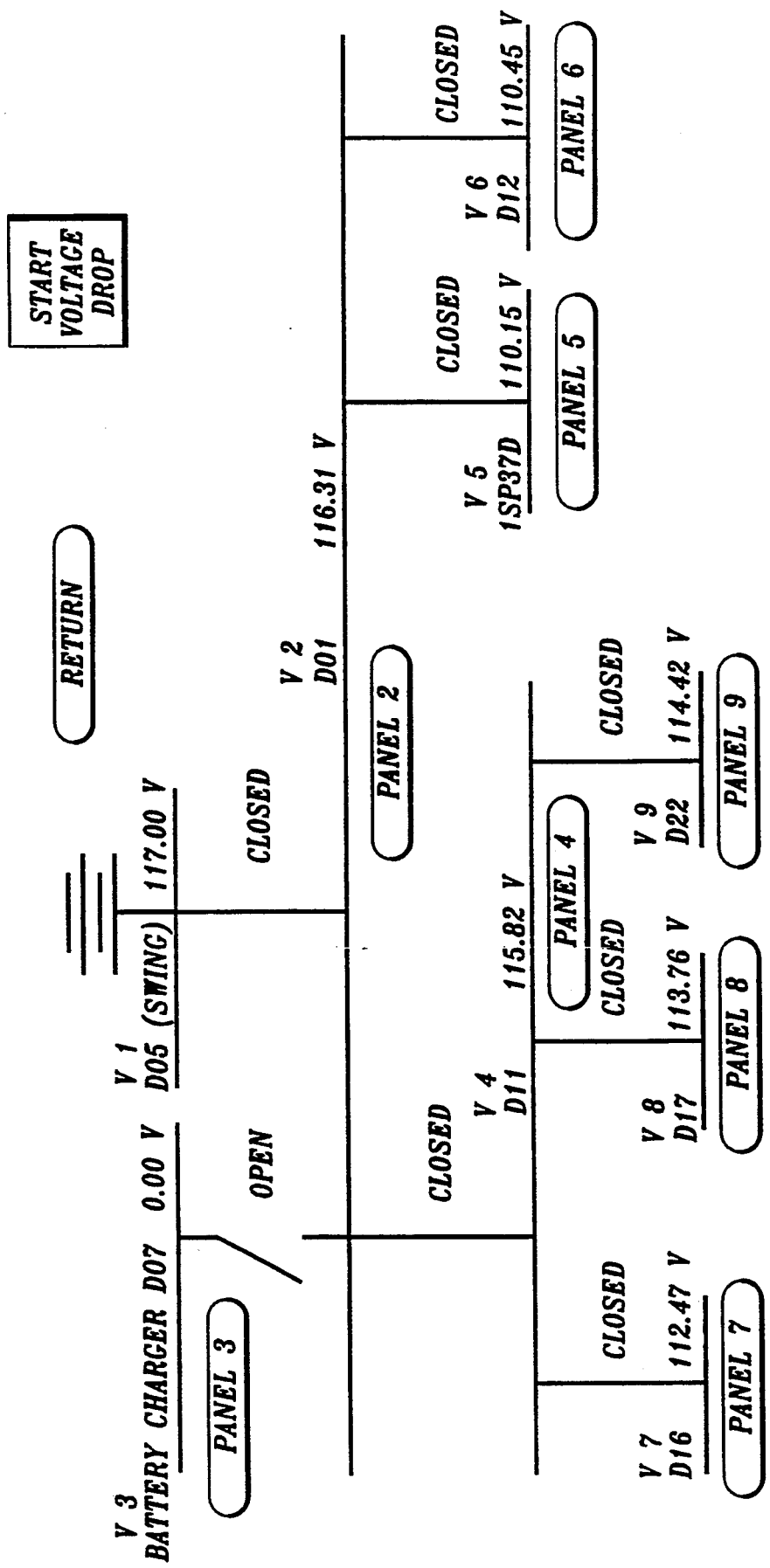
FIG. 13 is a schematic representation of a one line diagram for a simple network.

Steps 1 through 5 can be repeated for each bus, until the network architecture is fully modelled (see FIG. 13 for a simple network). If a bus that exists on the single-line drawing is no longer needed, the reverse process can be performed to place the cells and graphical objects over with the other unused buses.

After the single-line drawing has been created, edited and protected, the VD—1LINE.XLS spreadsheet 130 should be saved and closed. The next time that the single-line drawing is opened, the bus connections, voltages, and bus names will automatically be updated with the most recently calculated voltage drop information. If the voltage drop calculations have not been performed, the bus connections will be shown open and bus voltages will be zero.

The short circuit single-line drawing graphically displays the results of the most recently performed short circuit calculations. However, the single-line is not necessary to perform these calculations since the same results are also displayed on the SC—CALC.XLS spreadsheet. The short circuit single-line drawing SC—1LINE.XLS file 132 is opened by selecting the command {Short Circuit Single-Line} under the heading {Display} on the ELF custom menu bar. The connections between the buses on the system are updated automatically each time the single-line drawing is opened. If no connection information to a specific bus is given on the INPUT.XLS spreadsheet, the bus connection will be shown in the open position. The fault currents on all buses are updated each time the short circuit calculation is performed. The short circuit single-line is automatically created from the voltage drop single-line.

Once the voltage drop single-line is completed, the user can create the short circuit single-line by selecting the command {Create Short Circuit Single-Line} under the heading {Single-Line} on the ELF custom menu bar. The user will then be prompted with the question (Replace existing 'SC—1LINE.XLS'?). If the user responds "OK" a new short circuit single-line will be created If the user responds "cancel" the command is aborted. If the short circuit calculations have not been performed, the fault currents displayed on the short circuit single-line will be zero.

Since the short circuit single-line is automatically created from the voltage drop single-line, the process for editing the short circuit single-line is to first edit the voltage drop single-line and then create a new short circuit single-line.

The SC—1LINE.XLS spreadsheet 132 is similar to the VD—1LINE.XLS spreadsheet 130. Prefault bus voltages and short circuit currents are reported on this graphical one-line diagram. Pre-defined graphic representations of all the buses that are modeled on the VD—1LINE.XLS spreadsheet are copied to this spreadsheet. Bus Names, bus prefault voltages, and short circuit currents are linked to this spreadsheet and are located next to the corresponding bus. These values are updated after every short circuit current calculation. Prefault voltages and short circuit currents are linked from SC—CALC.XLS. Bus Names are linked from INPUT.XLS.

Bus/Panel Spreadsheet (PANELS.XLS)

The bus/panel spreadsheet is used to document the loads to be modeled at each bus. There is an individual bus/panel section for each individual bus (2 through 33) on the spreadsheet PANELS.XLS (as shown at 128 in FIG. 1). By selecting the command {Panel Loading} under the heading {Display} on the ELF custom menu bar, the user can view a specific bus/panel section on the spreadsheet PANELS.XLS. For example, the section of the spreadsheet with panel 2 data can be viewed if the selection "panel 2" is highlighted when "OK" is chosen.

Once the panel loading spreadsheet is open to reveal portions 134, 136 (see FIG. 13 and 14), the user can move to different sections of the sheet using the scroll bar on the right side of the display can be used to change the screen. The individual bus/panel sections are arranged vertically, in sequential order, on the PANELS.XLS spreadsheet starting with panel 2 at the top.

Each bus/panel section has several information only fields where the user can enter the "Circuit Breaker Numbers", "Circuit Descriptions", and "Circuit Braker Ratings" (see FIG. 14). The required fields for the loading data on each bus must be entered before executing any calculations. The required fields for the loading data on each bus must be entered before executing any multiple "Time" voltage drop calculations. The calculated fields on the PANELS.XLS spreadsheet are updated automatically after the bus voltages are determined.

For Constant Power-"P" or constant impedance-"Z", the user is given the option of identifying the load(s) in a given row as either a constant power "P" or a constant impedance "Z" load(s) (see FIG. 14). The Load Ratings, Power(W), Current(A), and Voltage(V), are also entered as shown in FIG. 15. The load rating for each load device can be entered on the bus/panel spreadsheet (see FIG. 14 in two ways: 1.) rated power (in watts) or (2) rated current in (amps). If a load is entered as a constant power load and the rated power (in watts) is entered for the device, the voltage field is not necessary. The voltage field is required for the device if the load is being modeled as a constant impedance device or if the load is being modeled as a constant power device and the rated current (in amps) is entered for the device. Rated power is the default value used in calculations if both rated power and rated current are entered. Loads can be entered individually or as groups of loads (e.g., 12 relays rated at 10 W and 125 V each, can be entered as 12-10 W/125 V loads or as 1-120 W/125 V load). The values to be entered in each of these fields can be entered as either a number or a formula (e.g., For a 10 hp motor with an efficiency of 85%, the power can be entered as a number: "8776.5" or as a formula: "=(10*746/.85"). The format which must be used for entering a formula is the same standard format that is required by Microsoft ® Excel ™.

The loads entered on the bus/panel spreadsheet can be toggled ON=1 or OFF=0. This field allows the user to temporarily disconnect a load from the system model without having to delete the load rating data associated with that load. Loads which have two different ratings can have both ratings entered on the bus/panel spreadsheet (e.g., starting and steady-state loading, two speed motors and accident versus emergency loading). One condition can be toggled ON=1 while the other is toggled OFF=0, depending on the instant in time represented by the load flow model. For multiple "Time" voltage drop calculations multiple load toggle settings can be saved.

Load toggle settings and the battery terminal voltage are required for each instant in time being analyzed. The battery terminal voltage (volts) and time (minutes) are entered at the top of the PANELS.XLS spreadsheet (see FIG. 15). The toggle settings for all of the loads at each of the buses/panels are entered in the column labeled "Toggle" (ON=1, OFF=0). Since the battery terminal voltage and load toggle settings are time dependent, these values must be stored relative to time numbers. This data can be stored, edited, or cleared using the commands under the head {Time} from the ELF custom menu bar. The method for using the three commands under the heading {Time} are described in detail below.

Figure 16:
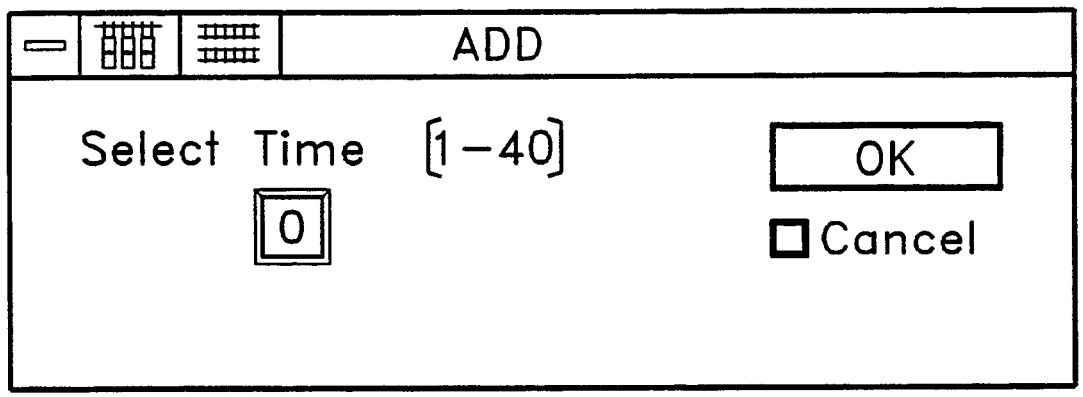
FIGS. 16, 17 and 18 show images of dialog windows associated with the entry of profile time point data in the PANELS spreadsheet.
Figure 17:
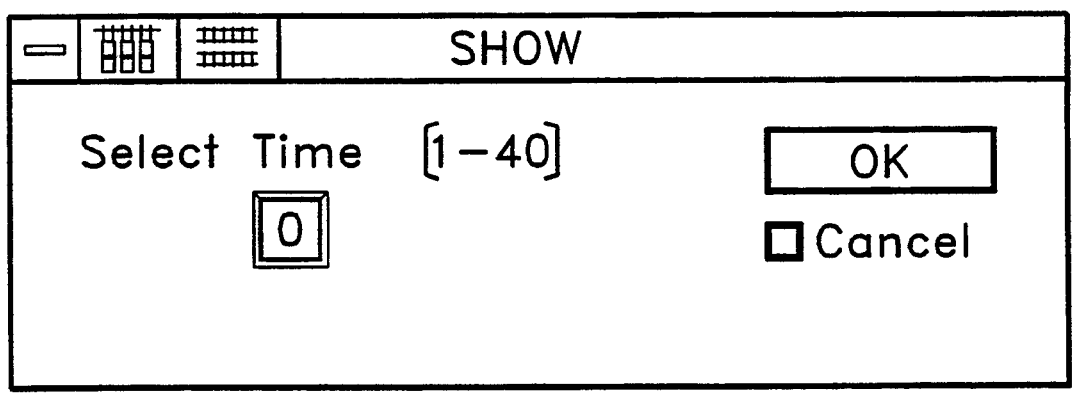
Figure 18:
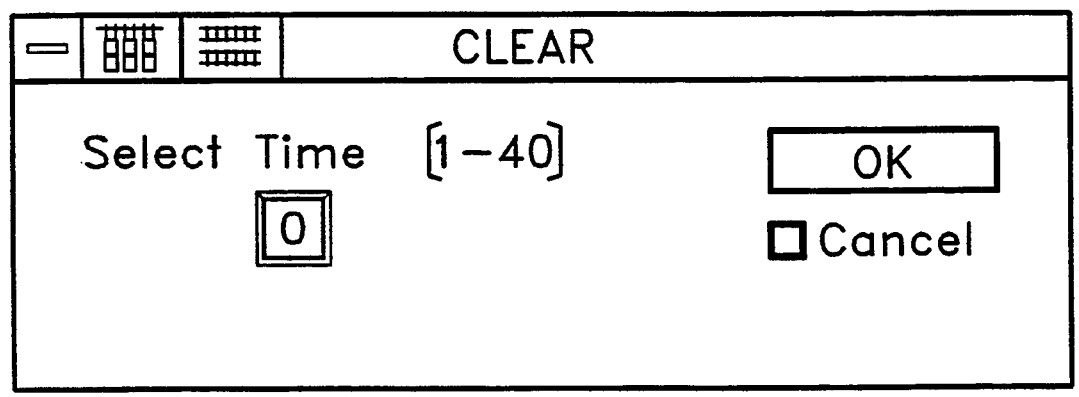

As shown in the dialog boxes of FIGS. 16–18, the command {Add Time Data} saves the load toggle settings and the battery terminal voltage as a "Time number" (1–40). The user must type in a time number (1–40) to identify where the data will be stored (see FIG. 16). If the time number chosen is the same as a previously saved time number, the old data is replaced with the new data.

The second command {Show Stored Time Data} changes the load toggle settings and the battery terminal voltage on the bus/panel spreadsheet to the values of a previously stored "Time number" (1–40). The dialog box shown in FIG. 17 appears when this command is selected from the ELF custom menu bar. The user must select a time number (1–40) to identify the location of the data to retrieve. The data stored under the time number chosen, is placed into the fields used in calculations.

The third command {Clear Stored Time Data} clears the load toggle settings and the battery terminal voltage of a previously stored "Time number" (1–40). The dialog box shown in FIG. 18 appears when this command is selected from the ELF custom menu bar. The user must select a time number (1–40) to identify the location of the data to be cleared. The cleared data stored under the time number chosen, is placed into the fields used in calculations.

Resistance (Ohms), Power (W) and Corrected Current (A) fields are calculated and displayed for each row in portion 138 of the bus/panel spreadsheet (see FIG. 19). These fields are automatically updated each time the voltage drop calculations are performed and the bus/panel spreadsheet is saved. Since the Corrected Current (A) field depends on the calculated bus voltage, this field is not updated until after the voltage drop calculations are performed.

The total panel resistance, total panel power, total panel admitance, and total current at this panel (not including any downstream feeds) can also be calculated and displayed for each bus/panel section. These fields are automatically updated each time that a bus/panel spreadsheet is saved/closed and after each time that voltage drop calculations are performed. The bus/panel spreadsheet also converts the calculated resistance value into an admittance which is used in the load flow calculations. Since the corrected current fields depend on the calculated bus voltages, these fields are not updated until after the voltage drop calculations are performed.

Short Circuit Calculations

Short circuit calculations determine the bus prefault voltages and fault currents based on the system load conditions and bus connections. The short circuit calculations can be performed after all of the required system configuration and panel load data has been entered.

In order for the short circuit calculations to accurately represent the system being modeled, all bus connections must be entered and all loads must be entered on the appropriate panel sheets. Preliminary short circuit calculations can be performed before all of the input data is entered, however, the user must realize that the results obtained do not represent the complete system.

Figure 22:
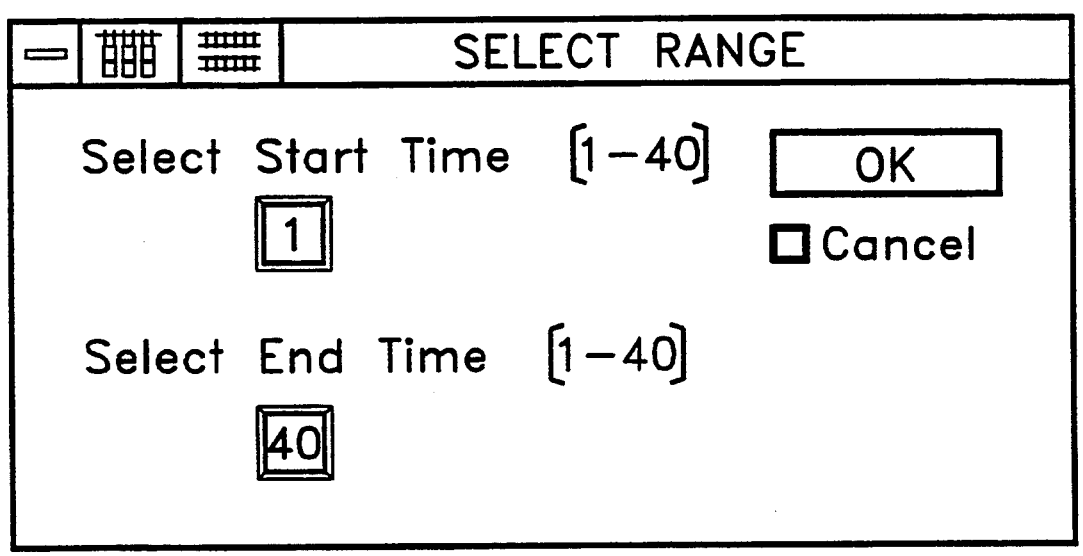
FIG. 22 is a reproduction of a dialog image from the monitor, by which the user can select which time points in a particular profile are to be computed.

The user can execute short circuit calculations by selecting the command {Short Circuit} under the heading {Calculations} on the ELF custom menu bar. The user can view the computed values as the program automatically calculates the prefault voltages at each bus being modeled on the system. The user should watch the prefault voltages being calculated in portion 140 of the CALC spreadsheet (see FIG. 22) to see if the numbers are converging (i.e., the change in prefault voltage at a given bus becomes smaller between iterations). If the numbers do not seem to be converging after several iterations, the user will need to stop the program execution by pressing the "Esc" key. After the macro interrupt prompt is displayed the user should select the "Halt" button.

Before calculations are restarted, all errors in the input data must be corrected or the program will continue to diverge. The most common error is usually a combination of a large load fed from a relatively small size conductor over a long distance.

The calculated prefault voltages and short circuit currents are displayed on portions 140, 142 of the SC__

CALC.XLS spreadsheet 126 (see FIGS. 1, 20 FIG. 21). These results can also be displayed on the short circuit single-line drawing 132, if one was created. First, the user selects the command {Main Input} under the heading {Display} on the ELF custom menu bar. Second, the user selects the command {Short Circuit Single-Line} under the heading {Display} on the ELF custom menu bar. The calculated fault currents and bus connections are updated each time that this procedure is followed.

Voltage Drop Calculations

Voltage drop calculations determine the available bus voltages at a specified instant in time based on the system load conditions and bus connections. The voltage drop calculations can be performed after all of the required system configuration and panel load data has been entered.

In order for the voltage drop calculations to accurately represent the system being modeled, all bus connections must be entered and all loads must be entered on the appropriate panel sheets. Preliminary voltage drop calculations can be performed before all of the input data is entered, however, the user must realize that the results obtained do not represent the complete system.

The user can execute voltage drop calculations by selecting the command {Voltage Drop} under the head {Calculations} on the DC/ELF custom menu bar. The user should watch the voltages being calculated (see FIG. 21) to see if the numbers are converging (i.e., the change in voltage at a given bus becomes smaller between iterations). The calculated voltages are displayed on the VD_CALC.XLS spreadsheet 122.

These results can also be displayed on the voltage drop single-line drawing 130, if one was created. First, the user selects the command {Main Input} under the heading {Display} on the DC/ELF custom menu bar. Second, the user selects the command {Voltage Drop Single-Line} under the heading {Display} on the DC/ELF custom menu bar. The calculated voltages and bus connections are updated each time that this procedure is followed.

Multiple "Time" Voltage Drop Calculations

Multiple "Time" voltage drop calculations determine the available bus voltages at several specific instants in time based on the battery terminal voltages and system load conditions. The voltage drop calculations can be performed over a range of "Time" after all of the required system configuration and panel load data has been entered. The user can execute voltage drop calculations by selecting the command {Multiple "Time" Voltage Drop} under the heading {Calculations} on the ELF custom menu bar. After this command is selected, the user is prompted to select a "Time" range (see FIG. 22). For example if the user selects a range starting with time 1 and ending with time 3, voltage drop calculations for times 1, 2, and 3 will be performed.

After all of the selected voltage drop calculations have been performed the multiple "Time" summary spreadsheet 144, TOTALS.XLS, is displayed (see FIG. 1). The portions 146, 148 of spreadsheet 144 (shown in FIGS. 23 and 24) have the total panel current and voltage values for each "Time". The current values are calculated at the bottom of each bus/panel section on the PANELS.XLS spreadsheet. The panel voltages for each "Time" are calculated on the VD_CALC.XLS spreadsheet. FIGS. 23 and 24 only show three columns of the TOTALS.XLS spreadsheet for time numbers 1, 2, and 3 results. Additional columns for time numbers 4 through 40 exist on the spreadsheet. The values displayed on the summary sheet are updated only when the user selects the command {Multiple "Time" Voltage Drop} under the heading {Calculations} on the custom menu bar. The user can view previously calculated results on the summary sheet by selecting the command {Multiple "Time" Summary} under the heading {Display} on the custom menu bar. The user can also clear a range of results by selecting the command {Clear Multiple "Time" Summary} under the heading {Display} on the custom menu bar.

Printing Input Data and Calculation Results

After the desired calculations have been performed on a given system, the input data and results can be printed by using the pull-down menu commands under the heading {ELF Printing}. The print commands become active depending on which spreadsheet is currently active. The Panel Loading Data command allows the user to print panel sheet sections from the PANELS.XLS spreadsheet.

The user must be aware that when printing results from the PANELS.XLS spreadsheet, voltage drop calculations that correspond with the toggle settings and battery terminal voltage must be current. In some cases, the print command {Panel Loading Data} becomes disabled. For example, if the user opens the PANELS.XLS spreadsheet and selects the command {Show Stored Time Data}, the print command {Panel Loading Data} becomes disabled. The print command {Panel Loading Data} is active when the PANELS.XLS spreadsheet is first opened or after the voltage drop calculations have been performed, however, if the user opens the PANELS.XLS spreadsheet and then manually changes some of the load toggle settings, the calculated load currents are not accurately recalculated until after a voltage drop calculation has been performed.

The Short Circuit Results command allows the user to print two sections of the SC_CALC.XLS spreadsheet. The section of the spreadsheet where bus prefault voltages are calculated is printed first and the section of the spreadsheet where short circuit currents are calculated is printed last. The Short Circuit Single-Line command allows the user to print the short circuit single-line drawing SC_1LINE.XLS, with the most recently calculated voltage drop results. The Voltage Drop Results command allows the user to print the section of the VD_CALC.XLS spreadsheet where bus voltages are calculated.

The Voltage Drop Single-Line command allows the user to print the voltage drop single-line drawing VD_1LINE.XLS, with the most recently calculated voltage drop results.

The All Panel Current Totals and All Panel Voltages commands allow the user to print the results from multiple "Time" voltage drop calculations from the TOTALS.XLS spreadsheet.

External Processing

Figure 25:
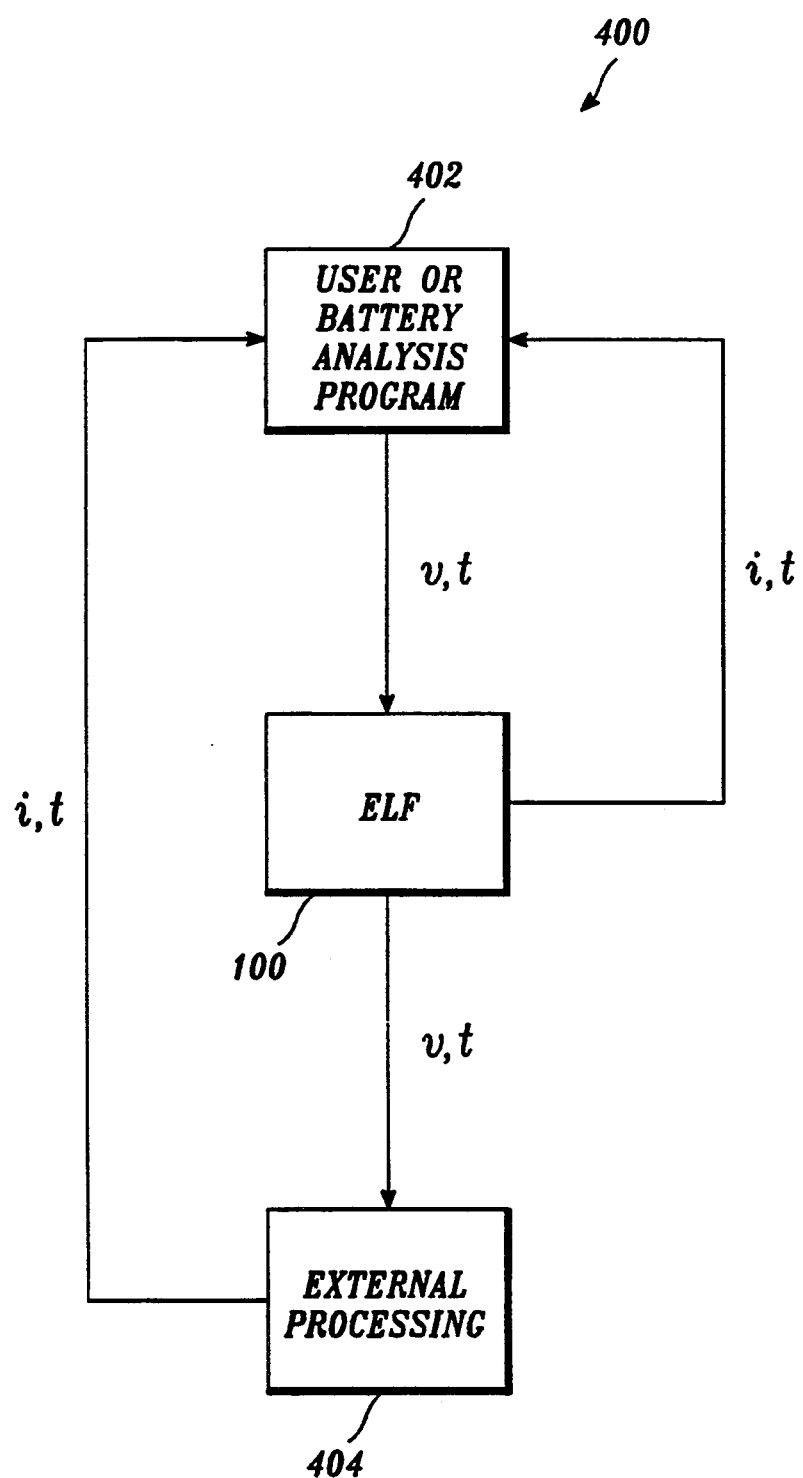
FIG. 25 is a schematic representation of how the invention can be connected to external programs such as a battery analysis tool.

The invention can be used to perform a simple step analysis as well as very detailed complex, multiple step analyses. The inputs to ELF may come from the user or from battery analysis tools such as the BATTPRO TM program available from ABB Impell Corporation, Lincolnshire, Ill. Likewise, results obtained from ELF can be used as inputs to other analyses and ultimately to these battery analysis tools. An iterative process 400 can then occur to provide more precise and accurate results as shown in FIG. 25. For example, voltage and time step values (v,t) are communicated from the battery discharge profile 402 to ELF 100. ELF performs network related computations and provides voltage and time (v,t) values to an external processing system 404, and current and time values back to the battery tool or user 402. The external processing system 404 can also return current and time step values to the battery tool or user 402.

Appendix

Macro Functional Descriptions

The user friendliness of the present invention is preferably enhanced by the pre-programed macro commands set out below. An ordinarily skilled programmer could readily write the code to perform the macro functions, based on the description in the main portion of the present specification taken in conjunction with the appended drawings.

The user enters the macro command in the User Input Field shown in FIG. 3.

Macro "SC_CALC" performs calculations and manipulations to perform short circuit calculations. The short circuit Y-bus is selected and inverted into the Z-Bus. This macro is invoked by pull down-menu selection.

Macro "reset_sc" re-initializes short circuit prefault voltages back to the original seed value(s). This is selected by the user when the Y-Bus becomes corrupted and voltages fail to converge. This macro is invoked by pull down-menu selection.

Macro "VD_CALC" initiates and performs voltage drop calculations. This macro is invoked by pull down-menu selection.

Macro "reset_vd" re-initializes voltage drop voltages back to the original seed value(s). This is selected by the user when the Y-Bus becomes corrupted and voltages fail to converge. This macro is invoked by pull down-menu selection.

Macro "UD_SCY" updates the short circuit Y-bus. The existing data, if any, is erased. Cable admittances are then moved into the cable Y-Bus matrix. This routine should only fill in columns and rows for the existing number of buses, not the entire range of 33×33. This is a subroutine that is invoked whenever a voltage drop calculation is required.

Macro "UD_VDY" updates the voltage drop circuit Y-bus. The existing data, if any, are erased. Cable admittances are then moved into the cable Y-Bus matrix. This routine should only fill in columns and rows for the existing number of buses, not the entire range of 33×33. This subroutine is invoked whenever a voltage drop calculation is required.

Macro "VD_SINGLELINE" takes the user to VD_1LINE.XLS, and update switch positions. If the voltage for a bus is zero the switch position is shown open. This macro is invoked by pull down-menu selection.

Macro "SC_SINGLELINE" takes the user to SC_1LINE.XLS. If the voltage for a bus is zero added, the switch position is shown open. Short circuit currents from SC_CALC.XLS are moved to this SC_1-LINE.XLS. If short circuit currents are greater than zero, switches are shown as closed. This macro is invoked by pull down-menu selection.

Macro "VD_SINGLELINE_EDIT" unprotects VD_1LINE.XLS and displays all hidden graphics. This macro is invoked by pull down-menu selection.

Macro "create_sc_line" copies the single line on VD_1LINE.XLS TO SC_1LINE.XLS. Voltage drop information is removed and fault currents from SC_CALC.XLS added. This macro is invoked by pull down-menu selection.

Macro "time_int_new" saves all toggle, battery voltage, and battery time information currently stored in the panelboards to a user assigned time interval. The time interval is selected by dialog box, invoked by pull down-menu selection.

Macro "total_int_currents" initiates multiple voltage drop studies. The user selects the range of time interval to be calculated via dialog box, invoked by pull down-menu selection.

Macro "time_int_show" moves a user selected time interval to all the panelboards on PANELS.XLS. The time interval is selected via dialog box, invoked by pull down-menu selection.

We claim:

1. A programmed digital computer system for a user to visualize time dependant load flow characteristics of a direct current electrical network, wherein the direct current electrical network has a network architecture of connected elements that include a battery having a time dependant capacity from which current can be drawn at terminal voltages, and a plurality of buses connected to the battery, each bus being defined by a node having one input cable and at least one output cable, said at least one output cable being connected to a resistive or impedance load device, which at any point in time can be in a condition that can change between a functional condition that can be toggled on to enable a load, or off to disable a load and a short circuit fault condition, wherein the direct current electrical network is subjected to a use profile by which the condition of at least one of the resistive or impedance load devices is changed during a period of time from initiation of the use profile to termination of the use profile, such that each node has a time dependant voltage and current, said programmed digital computer system comprising:

a processor;

an operating system program for controlling the processor;

display means for presenting a visual image to the user;

spreadsheet applications program means under the control of the processor, for:

(a) storing in linked data files, data representative of (i) the network architecture, (ii) a one-line diagram of the network architecture, (iii) electrical performance characteristics of said connected elements of the direct current electrical network, and (iv) the use profile, (b) performing mathematical computations of voltages and currents at the nodes using data from the linked data files, and (c) storing results of the mathematical computations in load flow files; and interface means coupled to the display means and the operating system program for the user to:

(a) enter into said linked data files, said data representative of:
  (i) the network architecture,
  (ii) the one-line diagram of the network architecture,
  (iii) the electrical performance characteristics of said connected elements of the direct current electrical network, and
  (iv) the use profile,
(b) construct from said data stored in said linked data files and view on the display means, the one-line diagram of the network architecture,
(c) initiate the performance of the mathematical computations, and
(d) view on the display means during the performance of the mathematical computations, the voltages and currents computed by said mathematical computations.

2. The system of claim 1, wherein the data representative of the electrical performance characteristics of said connected elements of the direct current electrical network include cable resistance values per unit of cable length for a variety of different kinds of cables.

3. The system of claim 1, wherein the data representative of the network architecture include,
a length and a kind of each input and output cable for each node, and
a resistance or impedance of each resistance or impedance load device.

4. The system of claim 1, wherein the data representative of the use profile include the condition of each resistive or impedance load device at each of a plurality of elapsed time points after the initiation of the profile.

5. The system of claim 1, wherein the spreadsheet applications program means for performing the mathematical computations first computes a voltage at each node and then computes a short circuit current at each node.

6. The system of claim 1,
wherein the data representative of the electrical performance characteristics of said connected elements of the direct current electrical network include cable temperature, battery voltage, time step data, cable lengths, load descriptions, load types, load values, fault contributing equivalent impedance at each bus, battery charger voltage, and battery charger fault limiting current.

7. A programmed digital computer system for a user to model time dependant load flow characteristics of a direct current electrical network, wherein the direct current electrical network has a network architecture of connected elements that include a battery having a time dependant capacity from which current can be drawn at a terminal voltage, and a plurality of buses connected to the battery, each bus being defined by a node having one input cable and at least one output cable, said at least one output cable being connected to a resistive or impedance load device which at any point in time can be in a condition than can change between a functional condition which can be toggled on to enable a load or off to disable a load and a short circuit fault condition, and wherein the direct current electrical network is subjected to a use profile by which the condition of at least one of the resistive or impedance load devices is changed during a period of time from initiation of the use profile to termination of the use profile, such that each node has a time dependant voltage and current, said programmed digital computer system comprising:
a processor;
an operating system program for controlling the processor;
display means for presenting a visual image to the user;
spreadsheet applications program means under the control of the processor, for:
  (a) storing in linked data files, data representative of
    (i) the network architecture,
    (ii) electrical performance characteristics of said connected elements of the direct current electrical network, and
    (iii) the use profile,
  (b) performing first mathematical computations of voltages and currents at the nodes at a plurality of time points during the use profile using data from the linked data files,
  (c) storing results of the mathematical computations in load flow files, and
  (d) performing second mathematical computations of short circuit currents at each node based on data stored in the linked data files and the load flow files; and
interface means coupled to the display means and the operating system program for the user to:
  (a) enter into said linked data files, said data representative of
    (i) the network architecture,
    (ii) the electrical performance characteristics of said connected elements of the direct current electrical network, and
    (iii) the use profile,
  (b) initiate the performance of the first and second mathematical computations, and
  (c) view on the display means, the voltages and currents computed by said first mathematical computations, and the short circuit currents computed by said second mathematical computations.

8. A programmed digital computer system for a user to model time dependant load flow characteristics of a direct current electrical network, wherein the direct current electrical network has a network architecture of connected elements that include a battery having a capacity profile including a rated energy output from which current can be drawn at a terminal voltage, which diminishes as a function of energy drawn from the battery, and a plurality of buses connected to the battery, each bus defined by a node having one input cable and at least one output cable, said at least one output cable being connected to a resistive or impedance load device that is time dependent, such that each node has a time dependant voltage and current, said programmed digital computer system comprising:
a processor;
an operating system program for controlling the processor;
display means for presenting a visual image to the user;
a spreadsheet applications program under the control of the processor, for:
  (a) storing in linked data files, data representative of
    (i) the network architecture,
    (ii) electrical performance characteristics of said connected elements of the direct current electrical network, and (iii) the capacity profile of the battery,
(b) performing first mathematical computations of voltages and currents at the nodes using data from the linked data files, and
(c) performing second mathematical computations of short circuit currents at each node, taken individually, based on the voltages computed by said first mathematical computations; and interface means coupled to the display means and the operating system program for the user to
(a) enter into said linked data files, said data representative of
  (i) the network architecture,
  (ii) the electrical performance characteristics of Said connected elements of the direct current electrical network, and
  (iii) the capacity profile of the battery,
(b) initiate the performance of the first and second mathematical computations, and
(c) view on the display means during the performance of the first and second mathematical computations, the voltages and currents computed by said first mathematical computations and the short circuit currents computed by said second mathematical computations.

9. A method for using a programmed digital computer system to determine a short circuit fault current at each node of a direct current electrical network, wherein the direct current electrical network has a network architecture of connected elements that include a battery having a capacity profile including a rated energy output from which current can be drawn at a terminal voltage, which diminishes as a function of energy drawn from the battery, a plurality of buses connected to the battery, each bus defined by a node having one input cable and at least one output cable, said at least one output cable being connected to a resistive or impedance load device that is time dependant, such that each node has a time dependant voltage and current, and circuit breaker means having a current rating, associated with each node, and wherein said programmed digital computer system includes a processor, an operating system program for controlling the processor, display means for presenting a visual image to a user, and a spreadsheet applications program under the control of the processor, the method comprising the steps of:

storing in linked data files of the spreadsheet applications program, data representative of:
(a) the network architecture,
(b) electrical performance characteristics of said connected elements of the direct current electrical network, and
(c) at least one of said resistive or impedance load devices;

performing a first set of mathematical computations of voltages and currents at the nodes based on data stored in the linked data files;

storing at least the voltages computed by said first set of mathematical computations;

from the voltages computed by said first set of mathematical computations, performing a second set of mathematical computations of short circuit currents at each node, taken individually; and comparing the short circuit currents computed by said second set of mathematical computations, with the current rating of the circuit breaker means associated with each node.

10. The method of claim 9, wherein said connected elements of the direct current electrical network include a battery charger, and the electrical performance characteristics of said connected elements of the direct current electrical network include:
a constant voltage to which the battery and the battery charger are set for the second set of mathematical computations;
a fault contributing equivalent impedance at each bus; and
a battery charger volt limiting current.

11. The method of claim 10, wherein the data representative of the network architecture include data describing connections of the buses, lengths and sizes of the cables; and wherein:
the data representative of the electrical performance characteristics include data describing whether each said resistive or impedance load device is on to enable a load, or off to disable the load, a load type for each said resistive or impedance load device of either a constant power or a constant impedance, and a load rating in power or current of each said resistive or impedance load device; and
a profile defines whether each said resistive or impedance load device is on or off.

* * * * *